(12) United States Patent
Ang et al.

(10) Patent No.: US 12,107,707 B2
(45) Date of Patent: *Oct. 1, 2024

(54) METHOD AND APPARATUS FOR LOW LATENCY CHARGE COUPLED DECISION FEEDBACK EQUALIZATION

(71) Applicant: Analog Bits Inc., Sunnyvale, CA (US)

(72) Inventors: Michael A. Ang, San Francisco, CA (US); Alan C. Rogers, Sunnyvale, VA (US)

(73) Assignee: Analog Bits Inc., Sunnyvale, CA (US)

( * ) Notice: Subject to any disclaimer, the term of this patent is extended or adjusted under 35 U.S.C. 154(b) by 0 days.

This patent is subject to a terminal disclaimer.

(21) Appl. No.: 18/217,395

(22) Filed: Jun. 30, 2023

(65) Prior Publication Data

US 2024/0113923 A1    Apr. 4, 2024

Related U.S. Application Data

(63) Continuation of application No. 17/525,609, filed on Nov. 12, 2021, now Pat. No. 11,729,029.

(60) Provisional application No. 63/239,272, filed on Aug. 31, 2021.

(51) Int. Cl.
*H04L 25/03* (2006.01)
*H03M 1/66* (2006.01)

(52) U.S. Cl.
CPC ........ *H04L 25/03885* (2013.01); *H03M 1/66* (2013.01); *H04L 25/03006* (2013.01)

(58) Field of Classification Search
CPC ........ H04L 25/03885; H04L 25/03006; H03M 1/66

USPC ........................................... 375/230
See application file for complete search history.

(56) References Cited

U.S. PATENT DOCUMENTS

| | | | |
|---|---|---|---|
| 7,729,453 B1 | 6/2010 | Li et al. | |
| 11,729,029 B2 | 8/2023 | Ang et al. | |
| 2007/0230640 A1* | 10/2007 | Bryan | H04L 25/03878 375/345 |
| 2008/0310495 A1 | 12/2008 | Bulzacchelli et al. | |
| 2009/0010320 A1 | 1/2009 | Hollis | |
| 2010/0202506 A1 | 8/2010 | Bulzacchelli et al. | |
| 2015/0312060 A1 | 10/2015 | Sinha | |

(Continued)

OTHER PUBLICATIONS

International Search Report and Written Opinion in International Appln. No. PCT/US2022/042082, mailed on Jan. 5, 2023, 12 pages.

*Primary Examiner* — Leila Malek
(74) *Attorney, Agent, or Firm* — Fish & Richardson P.C.

(57) ABSTRACT

A mixed signal receiver includes a first sample and hold (S/H) circuit having a first S/H input terminal to receive an analog input signal and a first S/H output terminal directly coupled to a first common node; a first data slicer having a first slicer input terminal coupled to the first common node; and a first data-driven charge coupling digital-to-analog converter (DAC) including: (i) a DAC input terminal to receive a first digital signal from a first digital output of the first data slicer, (ii) a DAC output terminal directly coupled to the first common node, (iii) a plurality of capacitor modules configured to be pre-charged during a sample phase, and (iv) logic components, wherein when the logic components toggle a voltage on the plurality of capacitor modules, charge is capacitively coupled to or from the first common node during an immediately subsequent hold phase.

21 Claims, 13 Drawing Sheets

(56) References Cited

U.S. PATENT DOCUMENTS

2017/0085403 A1     3/2017   Sun et al.
2023/0061840 A1     3/2023   Ang et al.

* cited by examiner

METHOD AND APPARATUS FOR LOW LATENCY CHARGE COUPLED DECISION FEEDBACK EQUALIZATION

CROSS-REFERENCE TO RELATED APPLICATIONS

This application is a continuation of U.S. patent application Ser. No. 17/525,609 filed Nov. 12, 2021, which claims benefit to U.S. Provisional Application No. 63/239,272, filed Aug. 31, 2021, the disclosure of which is incorporated by reference.

TECHNICAL FIELD

The disclosure generally relates to receiver equalization.

BACKGROUND

A transmission channel in a communication system can introduce inter-symbol interference (ISI) effects, which can potentially hamper the quality and capacity of the transmission channel. Receiver equalization (RxEQ) has long been employed in high speed serial communications to mitigate such effects.

SUMMARY

In one aspect, some implementations provide a mixed signal receiver that includes: a first sample and hold circuit having a first S/H input terminal to receive an analog input signal and a first S/H output terminal directly coupled to a first common node, wherein the first sample and hold circuit is configured to perform cycles at a symbol rate with each cycle including a sample phase and a hold phase, and wherein the first sample and hold circuit is configured to track the analog signal on the first S/H output terminal during the sample phase and to generate a high impedance on the first S/H output terminal during the hold phase to enable the sampled analog output voltage to be modulated during the hold phase; a first data slicer having a first slicer input terminal coupled to the first common node such that the first data slicer is directly driven by the first S/H output terminal; and a first data-driven charge coupling digital-to-analog converter (DAC) including (i) a DAC input terminal to receive a first digital signal from a first digital output of the first data slicer, (ii) a DAC output terminal directly coupled to the first common node, (iii) a plurality of capacitor modules configured to be pre-charged such that the DAC output terminal tracks an output voltage on the first S/H output terminal during the sample phase, and (iv) logic components at an interface of the first data-driven charge coupled DAC to receive the first digital signal and to control voltages applied to the plurality of capacitor modules based on the first digital signal such that if the logic components toggle a voltage on the plurality of capacitor modules then charge is capacitively coupled to or from the first common node during an immediately subsequent hold phase so that the capacitively coupled charge modulates the analog output voltage at the first S/H output terminal during the hold phase.

Implementations may include one or more of the following features.

The data slicer may be configured to resolve and settle the digital output signal on the DAC input terminal during the sample phase. The data slicer may be configured to latch and hold the digital output signal on the DAC input terminal during the hold phase. Each cycle mya consist of a single sample phase and a single hold phase. The symbol rate may be at least 24 Gbaud.

The mixed signal receiver may include a plurality of data-driven charge coupling digital-to-analog converters (DACs), the plurality of data-driven charge coupling DACs including the first data-driven charge coupling DAC, each respective data-driven charge coupling DAC of the plurality of data-driven charge coupling DACs including (i) a respective DAC input terminal to receive a respective digital signal, (ii) a respective DAC output terminal directly coupled to a node, (iii) a respective plurality of capacitor modules configured to be pre-charged such that the respective DAC output terminal tracks an output voltage on an S/H output terminal during the sample phase, and (iv) respective logic components at an interface of the respective data-driven charge coupled DAC to receive the respective digital signal and to control respective voltages applied to the respective plurality of capacitor modules based on the respective digital signal such that if the respective logic components toggle a respective voltage on the respective plurality of capacitor modules then charge is capacitively coupled to or from the node during an immediately subsequent hold phase so that the capacitively coupled charge modulates the analog output voltage at the S/H output terminal during the hold phase.

Each respective DAC output terminal may be directly coupled to the first common node, and each respective DAC output terminal tracks the output voltage on the first S/H output terminal. The mixed signal receiver may further include: one or more latches connected in a series, wherein a first latch in the series is driven by the digital output signal of the data slicer, and wherein each respective latch in the series is configured to provide a corresponding digital signal to a respective DAC input terminal of a respective data-driven charge coupling DAC from the plurality of data-driven charge coupling DACs. Each latch in the series may be configured to settle the corresponding digital signal on the input terminal of the respective charge coupling DAC during the sample phase, and wherein each latch in the series is configured to hold the digital signal on the respective DAC input terminal of the respective charge coupling DAC during the hold phase.

The mixed signal receiver may include a plurality of slicers that include the first data slicer, wherein the plurality of slicers and plurality of charge coupling DACs are arranged in a plurality of parallel signal processing lines, each respective signal processing line including a respective slicer from the plurality of slicers, and a respective charge coupling DAC from the plurality of charge coupling DACs. The mixed signal receiver may include a plurality of threshold-modifying DACS with each threshold-modifying DAC containing a plurality of charge coupling capacitors, each respective slicer of the plurality of slicers having a respective first input terminal and a respective second input terminal connected in isolation from second input terminals of other slicers to a respective second common node from a plurality of second common nodes, and wherein each respective charge coupling capacitor of the plurality of charge coupling capacitors includes a respective first terminal connected mutually in common to the respective second common node. The plurality of slicers may include a plurality of data slicers, and wherein the respective first input terminal of each respective data slicer of the plurality of data slicers is connected in common to the first common node and the respective DAC output terminal of each data-driven charge coupling DAC is connected in common to the first common node.

The plurality of slicers may include the data slicer and a transition slicer, wherein the respective first input terminal of the data slicer is connected in isolation from the first input terminal of the transition slicer to the first common node, and wherein the respective first input terminal of the transition slicer is connected in isolation from the first input terminal of the data slicer to a third common node. The respective DAC output terminal of each data-driven charge coupling DAC that is coupled to the input terminal of the data slicer may be connected to the first common node in isolation from the DAC output terminal of any data-driven charge coupling DAC that is coupled to the input terminal of the transition slicer, and the respective DAC output terminal of each data-driven charge coupling DAC that is coupled to the input terminal of the transition slicer is connected to the third common node in isolation from the DAC output terminals of other any data-driven charge coupling DAC that is coupled to the input terminal of the data slicer.

The mixed signal receiver may include a second sample and hold circuit having a second S/H input terminal and a second S/H output terminal, wherein the second S/H input terminal is configured to receive a single-ended or differential signal voltage of the analog input signal, wherein the second S/H output terminal is directly coupled to the third common node. The second sample and hold circuit may be configured to track the single ended or differential signal voltage on the second S/H output terminal during the hold phase and to generate a high impedance on the second S/H output terminal during the sample phase to enable the sampled single ended or differential signal voltage to be modulated during the sample phase such that (i) a respective DAC output terminal of any data-driven charge coupling DAC that is coupled to the input terminal of the transition slicer tracks the single-ended or differential signal voltage on the second S/H output terminal of the second sample and hold circuit during the hold phase (ii) the charges on the charge coupling capacitors of any data-driven charge coupling DAC that is coupled to the input terminal of the transition slicer tracks are coupled to the second S/H output terminals of the second sample and hold circuit during the sample phase.

An output of a respective data slicer within a respective particular signal processing line may be directed only to one or more components within the particular signal processing line. The logic components at the interface of each data driven charge coupling DAC may be configured to apply a coupling function for each data-driven charge coupling DAC of the plurality of data-driven charge coupling DACs such that analog voltage outputs from the data-driven charge coupling DACs are linearly summed according to the coupling function for each data-driven charge coupling DAC, wherein the coupling function includes one or more of a coupling direction, a coupling intensity, or a coupling gating. The mixed signal receiver may include one or more latches connected in a series between the digital output signal of the first data slicer and the respective DAC input terminal of a corresponding charge coupling DAC, and wherein the logic components of the corresponding DAC are configured to receive the one or more digital output signals through the one or more latches. The logic components of the first data driven charge coupling DAC may be configured to receive the first digital output without an intervening latch.

The mixed-signal receiver may include a threshold modifying DAC containing logic components and a plurality of charge coupling capacitors, and wherein each charge coupling capacitor includes a first terminal for an output and a second terminal coupled to the logic components. The threshold modifying DAC may be configured to: pre-charge a first terminal of each charge coupling capacitor to track a common-mode or reference output voltage on the S/H output terminals during the sample phase; and based on threshold modifying coefficients associated with input to the logic components of the threshold modifying DAC, couple the charges on the charge coupling capacitors to the S/H output terminal during the hold phase. The logic components of the threshold-modifying DAC may be configured to receive logic signals from one of: an adaptation logic controller, a state machine, or a microcontroller. Logic components of the threshold modifying DAC may be configured to determine how to pre-charge the second terminal and whether to retain a pre-charged voltage based on a decision function that does not include data slicer or latch output as an input value.

The first terminal of each charge coupling capacitor of the threshold-modifying DAC may be directly coupled to the first common node. The mixed signal receiver may include a second sample and hold circuit having a second S/H input terminal and a second S/H output terminal, wherein the second S/H input terminal is configured to receive the common mode or reference voltage of the analog input signal, wherein the second S/H output terminal is directly coupled to a second common node, wherein the first data slicer includes a second slicer input terminal coupled to the second common node, and wherein the first terminal of each charge coupling capacitor of the threshold-modifying DAC is directly coupled to the second common node. The logic components of the first data driven charge coupling DAC may be configured to receive the first digital output without an intervening latch.

The mixed signal receiver may include a threshold modifying DAC containing logic components and a plurality of charge coupling capacitors, and wherein each charge coupling capacitor includes a first terminal for an output and a second terminal coupled to the logic components. The threshold modifying DAC may be configured to: pre-charge a first terminal of each charge coupling capacitor to track a common-mode or reference output voltage on the S/H output terminals during the sample phase; and based on threshold modifying coefficients associated with input to the logic components of the threshold modifying DAC, couple the charges on the charge coupling capacitors to the S/H output terminal during the hold phase.

The logic components of the threshold-modifying DAC may be configured to receive logic signals from one of: an adaptation logic controller, a state machine, or a microcontroller. The logic components of the threshold modifying DAC may be configured to determine how to pre-charge the second terminal and whether to retain a pre-charged voltage based on a decision function that does not include data slicer or latch output as an input value. The first terminal of each charge coupling capacitor of the threshold-modifying DAC may be directly coupled to the first common node.

The mixed signal receiver may include a second sample and hold circuit having a second S/H input terminal and a second S/H output terminal, wherein the second S/H input terminal is configured to receive the common mode or reference voltage of the analog input signal, wherein the second S/H output terminal is directly coupled to a second common node, wherein the first data slicer includes a second slicer input terminal coupled to the second common node, and wherein the first terminal of each charge coupling capacitor of the threshold-modifying DAC is directly coupled to the second common node.

The first S/H input terminal of the first sample and hold circuit may be configured to receive a single-ended or differential signal voltage of the analog input signal and the first sample and hold circuit is configured to track the single-ended or differential signal output voltage on the first S/H output terminal during the sample phase and to generate a high impedance on each first output terminal during the hold phase to enable the sampled single-ended or differential output voltage to be modulated during the hold phase. The mixed signal receiver may further include a second sample and hold circuit having a second S/H input terminal and a second S/H output terminal, wherein the second S/H input terminal is configured to receive the reference voltage or common mode signal voltage of the analog input signal and wherein the second S/H output terminal is directly coupled to a second common node, wherein the second sample and hold circuit is configured to track the reference voltage or common mode signal voltage on the second S/H output terminal during the sample phase and to generate a high impedance on the second S/H output terminal during the hold phase to enable the sampled reference voltage or common mode signal voltage to be modulated during the hold phase such that (i) a respective DAC output terminal of the threshold modifying DAC tracks an output common mode voltage on the second S/H output terminal of the second sample and hold circuit during the sample phase, and (ii) charges on the charge coupling capacitors of the threshold modifying DAC are coupled to corresponding second S/H output terminals of the second sample and hold circuit during the hold phase; wherein the first data slicer may be configured to receive an output from first S/H output terminal of the first sample and hold circuit and to receive an output from the second S/H output of the second sample and hold circuit.

The first S/H input terminal of the first sample and hold circuit may be configured to receive the single-ended voltage of the analog input signal. The first sample and hold circuit may include a pair of first S/H input terminals configured to receive the differential signal voltage of the analog input signal.

The mixed signal receiver may include a second threshold modifying DAC; a third sample and hold circuit having a third S/H input terminal and a third S/H output terminal, wherein the third S/H input terminal is configured to receive the reference voltage or common mode voltage of the analog input signal, wherein the third S/H output terminal is directly coupled to a corresponding third common node, and wherein the third sample and hold circuit is configured to track the reference voltage or common mode signal voltage on the third S/H output terminal during the sample phase and to generate a high impedance on the third S/H output terminal during the hold phase to enable the sampled reference voltage or common mode signal voltage to be modulated during the hold phase such that (i) a respective DAC output terminal of the second threshold modifying DAC tracks an output reference or common mode voltage on the second S/H output terminal of the second sample and hold circuit during the sample phase, and (ii) the charges on the charge coupling capacitors of the second threshold modifying DAC are coupled to the third S/H output terminal of the third sample and hold circuit during the hold phase; an error slicer driven by the third sample and hold circuit and the first sample and hold circuit, wherein the error slicer and the data slicer are configured to sense the same modulated analog signal at the first S/H output terminal of the first sample and hold circuit.

The mixed signal receiver may include a third threshold modifying DAC; a fourth sample and hold circuit having a fourth S/H input terminal and a fourth S/H output terminal, wherein the fourth S/H input terminal is configured to receive the reference voltage or common mode voltage of the analog input signal, wherein the fourth S/H output terminal is directly coupled to a fourth common node, and wherein the fourth sample and hold circuit is configured to track the reference voltage or common mode signal voltage on the fourth S/H output terminal during the hold phase and to generate a high impedance on the fourth S/H output terminal during the sample phase to enable the sampled reference voltage or common mode signal voltage to be modulated during the sample phase such that (i) a respective DAC output terminal of the third threshold modifying DAC tracks an output common mode voltage on the fourth S/H output terminal of the fourth sample and hold circuit during the hold phase and (ii) the charges on the charge coupling capacitors of the third threshold modifying DAC are coupled to the fourth S/H output terminal of the fourth sample and hold circuit during the sample phase; a fifth sample and hold circuit having a fifth S/H input terminal and a fifth S/H output terminal, wherein the fifth S/H input terminal is configured to receive a single-ended or differential signal voltage of the analog input signal, wherein the fifth S/H output terminal is directly coupled to a fifth common node and wherein the fifth sample and hold circuit is configured to track the single ended or differential signal voltage on the fifth S/H output terminal during the hold phase and to generate a high impedance on the fifth S/H output terminal during the sample phase to enable the sampled single ended or differential signal voltage to be modulated during the sample phase such that (i) a respective DAC output terminal of a second data-driven charge coupling DAC tracks the single-ended or differential signal voltage on the fifth S/H output terminal of the fifth sample and hold circuit during the hold phase (ii) the charges on the charge coupling capacitors of the second data-driven charge coupling DAC are coupled to the fifth S/H output terminals of the fifth sample and hold circuit during the sample phase; a transition slicer driven by the fourth S/H output terminal of the fourth sample and hold circuit and the fifth S/H output terminal of the fifth sample and hold circuit; wherein the transition slicer is configured to resolve and settle the digital output signal on the DAC input terminal during the hold phase, and wherein the transition slicer is configured to latch and hold the digital output signal on the DAC input terminal during the sample phase.

The mixed signal receiver may include one or more latches connected in a series between the digital output signal of the data slicer and the respective DAC input terminal of a corresponding data-driven charge coupling DAC, and one or more half-latches, each half-latch being driven by a respective latch from the one or more latches connected in the series, wherein each half-latch is configured to provide a corresponding digital signal to the DAC input terminal of a respective charge coupling DAC from the one or more data-driven charge coupling DACs; and wherein the half-latches are configured to settle the corresponding digital signal on the input terminal of the respective charge coupling DAC during the hold phase, and to hold the digital signal on the input terminal of the respective charge coupling DAC during the sample phase.

Each capacitor module may include a first terminal and a second terminal. The first terminal of each capacitor module may be directly and commonly coupled to the DAC output terminal. The second terminal of each capacitor module may be coupled to the logic components. The logic components may be configured to determine: (i) during the sample phase, whether to pre-charge the second terminal to one of a first voltage or to a different second voltage, and (ii) during the hold phase, whether to retain a pre-charged voltage or to vary the second terminal to another of the first voltage or second voltage.

The first voltage may be a supply voltage and the second voltage may be ground. Each capacitor module may contain a first set of one or more charge coupling capacitors and a second set of one or more charge coupling capacitors. The first set of charge coupling capacitors may be pre-charged to the first voltage and switchable to the second voltage. The second set of charge coupling capacitors may be pre-charged to the second voltage and switchable to the first voltage. Switching the second terminal of each charge coupling capacitor during the hold phase may be dependent on an output of the first data slicer or one or more latches. Each charge coupling capacitor may hold a substantially identical quantum of switchable capacitance. Each charge coupling capacitor may hold a variable quanta of switchable capacitance. The variable quanta of switchable capacitance may be according to powers of 2. The logic components may be configured to determine one or more of the coupling direction, the coupling intensity, or the coupling gating based on predetermined values stored in registers.

The logic components may be configured to determine one or more of the coupling direction, the coupling intensity, or the coupling gating using a controller or state machine. The controller or state machine may be configured to determine the one or more of the coupling direction, the coupling intensity, or the coupling gating based on one or more of a clock signal indicating a phase of the sample and hold circuit, a digital output signal from the one or more digital output signals from the data slicer or latches, or a digital output signal from an error slicer.

The mixed signal receiver may include a linear amplifier configured to receive the input analog signal from a transmission channel and provide an analog voltage to the one or more S/H input terminals. The analog voltage may include: a differential voltage output, or a single-ended voltage output. The analog output voltage may include a differential analog output voltage and the sample and hold circuit comprises a pair of S/H output terminals to output the differential analog output voltage. The output terminals of the one or more charge-coupling DACs may be configured to symmetrically capacitively couple charge to or from the pair of S/H output terminals such that charge is augmented on one of the S/H output terminals while charge is simultaneously depleted on the other of the pair of S/H output terminals.

The first S/H input terminal of the first sample and hold circuit may be configured to receive a single-ended or differential voltage of the analog input signal and the first sample and hold circuit is configured to track the single-ended or differential voltage on the first S/H output terminal during the sample phase and to generate a high impedance on the first S/H output terminal during the hold phase to enable the sampled single-ended or differential voltage to be modulated during the hold phase; a second node to receive a reference voltage or common mode voltage; a DAC having low-impedance outputs coupled to the second common node; and wherein the first data slicer may be configured to receive a voltage from the first common node and to receive a voltage from the second common node.

In another aspect, some implementations provide a mixed signal receiver that includes: a first sample and hold circuit having a pair of first S/H input terminals to receive a differential analog input signal and a pair of first S/H output terminals each directly coupled to a respective common node from a pair of first common nodes, wherein the first sample and hold circuit is configured to perform cycles at a symbol rate with each cycle including a sample phase and a hold phase, and wherein the first sample and hold circuit is configured to track the differential analog signal on the pair of first S/H output terminals during the sample phase and to generate a high impedance on the pair of first S/H output terminals during the hold phase to enable the sampled differential analog output voltage to be modulated during the hold phase; a first data slicer having a pair of first slicer input terminals each coupled to a respective first common node of the pair of first common nodes such that the first data slicer is directly driven by the pair of first S/H output terminals; and a first data-driven charge coupling digital-to-analog converter (DAC) including (i) a DAC input terminal to receive a first digital signal from a first digital output of the first data slicer, (ii) a pair of DAC output terminals, each DAC output terminal directly coupled to a respective first common node of the pair of first common nodes, and (iii) a plurality of pairs of capacitor modules configured to be pre-charged such that during the sample phase the pair of DAC output terminals track a differential output voltage on the pair of first S/H output terminals that is directly connected to the pair of first common nodes, and (iv) logic components at an interface of the first data-driven charge coupled DAC to receive the first digital signal and to control voltages applied to the plurality of pairs of capacitor modules based on the first digital signal such that if the logic components toggle a voltage on the plurality of pairs of capacitor modules then charge is capacitively coupled to or from the pair of first common nodes during an immediately subsequent hold phase so that the capacitively coupled charge modulates the differential analog output voltage at the pair of S/H output terminals during the hold phase.

In yet another aspect, some implementations provide a mixed signal receiver that includes: a first sample and hold circuit having a first S/H input terminal to receive a single ended or differential signal voltage of an analog input signal and a first S/H output terminal directly coupled to a first common node, wherein the first sample and hold circuit is configured to perform cycles at a symbol rate with each cycle including a sample phase and a hold phase, and wherein the first sample and hold circuit is configured to track the single ended or differential signal voltage of the analog signal on the first S/H output terminal during the sample phase and to generate a high impedance on the first S/H output terminal during the hold phase to enable the sampled single ended or differential signal voltage of the analog input voltage to be modulated during the hold phase; a second sample and hold circuit having a second S/H input terminal to receive a reference or common mode signal voltage of the analog input signal and a second S/H output terminal directly coupled to a second common node, wherein the second sample and hold circuit is configured to perform cycles at the symbol rate with each cycle including a sample phase and a hold phase, and wherein the second sample and hold circuit is configured to track the reference or common mode signal voltage on the second S/H output terminal during the sample phase and to generate a high impedance on the second S/H output terminal during the hold phase to enable the sampled reference or common mode signal voltage to be modulated during the hold phase; a first data slicer having a first slicer input terminal coupled to the first common node and a second slicer input terminal coupled to the second common node such that the first data slicer is directly driven by the first and second S/H output terminals; a first data-driven charge coupling digital-to-analog converter (DAC) including (i) a DAC input terminal to receive a first digital signal from a first digital output of the first data slicer, (ii) a DAC output terminal directly coupled to the first common node, (iii) a plurality of capacitor modules configured to be pre-charged such that the DAC output terminal tracks an output voltage on the first S/H output terminal during the sample phase, and (iv) logic components at an interface of the first data-driven charge coupled DAC to receive the first digital signal and to control voltages applied to the plurality of capacitor modules based on the first digital signal such that if the logic components toggle a voltage on the plurality of capacitor modules then charge is capacitively coupled to or from the first common node during an immediately subsequent hold phase so that the capacitively coupled charge modulates the analog output voltage at the first S/H output terminal during the hold phase; and a first threshold modifying DAC digital-to-analog converter (DAC) including (i) a DAC input terminal to receive a second digital signal, (ii) a DAC output terminal directly coupled to the second common node, (iii) a plurality of charge coupling capacitors, and (iv) logic components at an interface of the first threshold modifying charge coupled DAC to receive the second digital signal and to control voltages applied to the plurality of charge coupling capacitors.

In still another aspect, some implementations provide: a first sample and hold circuit having a pair of first S/H input terminals to receive a differential voltage of an analog input signal and a pair of first S/H output terminals directly coupled to a pair of first common nodes, wherein the first sample and hold circuit is configured to perform cycles at a symbol rate with each cycle including a sample phase and a hold phase, and wherein the first sample and hold circuit is configured to track the differential voltage of the analog signal on the pair of first S/H output terminals during the sample phase and to generate a high impedance on the pair of first S/H output terminals during the hold phase to enable the sampled differential voltage of the analog input voltage to be modulated during the hold phase; a second sample and hold circuit having a pair of second S/H input terminals to receive a common mode of the analog input signal and a pair of second S/H output terminals directly coupled to a pair of second common nodes, wherein the second sample and hold circuit is configured to perform cycles at the symbol rate with each cycle including a sample phase and a hold phase, and wherein the second sample and hold circuit is configured to track the common mode voltage on the pair of second S/H output terminals during the sample phase and to generate a high impedance on the pair of second S/H output terminals during the hold phase to enable the sampled common mode voltage to be differentially modulated during the hold phase; a first data slicer having a pair of first slicer input terminals coupled to the pair of first common nodes and a pair of second slicer input terminals coupled to the pair of second common nodes such that the first data slicer is directly driven by the corresponding pair of first and second S/H output terminals; a first data-driven charge coupling digital-to-analog converter (DAC) including (i) a DAC input terminal to receive a first digital signal from a first digital output of the first data slicer, (ii) a pair of DAC output terminals directly coupled to the pair of first common nodes, (iii) a plurality of pairs of capacitor modules configured to be pre-charged such that the pair of DAC output terminals track a differential output voltage on the pair of first S/H output terminals during the sample phase, and (iv) logic components at an interface of the first data-driven charge coupled DAC to receive the first digital signal and to control voltages applied to the plurality of pairs of capacitor modules based on the first digital signal such that if the logic components toggle a voltage on the plurality of capacitor modules then charge is capacitively coupled to or from the pairs of first common nodes during an immediately subsequent hold phase so that the capacitively coupled charge modulates the differential analog output voltage at the pair of first S/H output terminals during the hold phase; and a first threshold modifying DAC digital-to-analog converter (DAC) including (i) a DAC input terminal to receive a second digital signal, (ii) a pair of DAC output terminals directly coupled to the pair of second common nodes, (iii) a plurality of pairs of charge coupling capacitors, and (iv) logic components at an interface of the first threshold modifying charge coupled DAC to receive the second digital signal and to control voltages applied to the plurality of pairs of charge coupling capacitors.

In yet another aspect, some implementations provide a mixed signal receiver that includes a first sample and hold circuit having a first S/H input terminal to receive an analog input signal and a first S/H output terminal directly coupled to a first common node, wherein the first sample and hold circuit is configured to perform cycles at a symbol rate with each cycle including a sample phase and a hold phase, and wherein the first sample and hold circuit is configured to track the analog signal on the first S/H output terminal during the sample phase and to generate a high impedance on the first S/H output terminal during the hold phase to enable the sampled analog output voltage to be modulated during the hold phase; a slicer module including a first data comparator and a second data comparator, each of the first data slicer comparator and second data slicer module having an input terminal directly coupled to the first common node, the slicer module further including a multiplexer configured to direct digital output signals from a selectable one of the first data slicer comparator and second data slicer comparator to a latch, the multiplexer selection being directed by the digital output of the latch which serves as the slicer module's output, the slicer module obviating the need for a corresponding data-driven DAC coupled to the first common node.

The details of one or more embodiments are set forth in the accompanying drawings and the description below. Other aspects, features, and advantages will become apparent from the description, the drawings, and the claims.

DESCRIPTION OF DRAWINGS

Like reference symbols in the various drawings indicate like elements.

DETAILED DESCRIPTION

Receiver equalization (RxEQ) techniques generally include combinations of feed-forward equalization (FFE), continuous time linear equalization (CTLE), and decision feedback equalization (DFE), along with the associated cost of power dissipation and silicon area. Such RxEQ techniques are prone to DFE loop latency. In particular, as DFE loop latency increases, the need for loop unrolling drives up the number of receiver sense-amplifiers (RSAs) by a factor of 2n, where n is the number of additional unit interval (UI) latencies needed to feedback a function of the resolved Rx data bit into the analog Rx input stream.

Implementations of the present disclosure leverage capacitive switches and, optionally, a cascade of flip-flop latches, so that the contributions from the cascade of feedback can be integrated in one unit interval (UI) and the total charges can be provided as feedback to the sampled and held input as the data stream arrives. For context, the term "unit interval" refers to the minimum time interval between condition changes of a data transmission signal. In some cases, this is also known as the pulse time or symbol duration time. A unit interval (UI) can correspond to the time taken in a data stream by each subsequent pulse (or symbol). When UI is used as a measurement unit of a time interval, the resulting measure of such time interval is dimensionless. It expresses the time interval in terms of UI. Very often, but not always, the UI coincides with the bit time, i.e. with the time interval taken to transmit one bit (binary information digit). Because the feedback is provided within one unit interval, this obviates the need for installing 2n RSAs otherwise called for by loop unrolling.

Additionally, capacitive switches can potentially maintain a constant net capacitance, regardless of dynamically adapted DFE coefficients used for the integration process. The invariant capacitance can enforce a consistent voltage resolution.

Referring to FIGS. 1A to 1D, various implementations can include a singled ended configuration, a differential configuration, a bifurcated configuration, and a bifurcated and differential configuration.

Figure 1A:
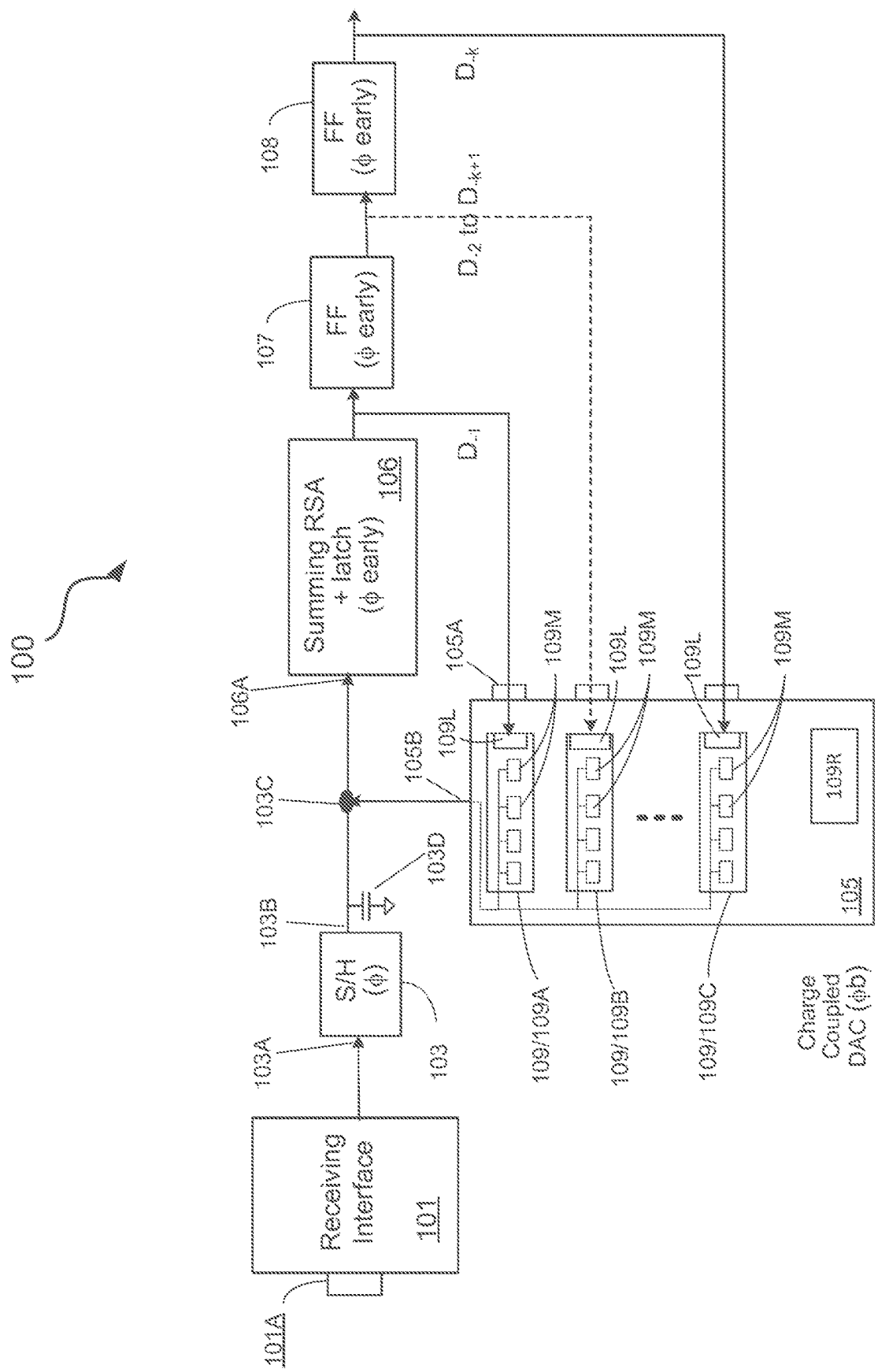
FIG. 1A illustrates an example of a receiver equalizer that incorporates a charge coupled decision feedback equalization (DFE) loop.

FIG. 1A shows a single-ended receiver equalizer 100 that includes a decision feedback equalization (DFE) loop according to some implementations of the present disclosure. For illustration, φb (which can be used interchangeably with $\bar{\varphi}$) and φ respectively designate the clock-low and clock-high phases of a high speed serial clock. In general, the clock-high φ can correspond to a sample phase and the clock low φb can correspond to a "hold" phase, as explained further below.

Continuing with FIG. 1A, an incoming input bitstream is received at an input terminal 101A of receiving interface 101, which is configured with proper electrostatic discharge (ESD) protection and impedance termination. For example, the receiving interface 101 can include a T-coil network and an electrostatic discharge (ESD) protection circuit. In some cases, the T-coil network includes mutual inductors configured for improving impedance matching and reducing the input return-loss. In these cases, a resistive termination network (RxZ) can be connected to T-coil network to improve, for example, impedance matching. Additionally or alternatively, receiving interface 101 may incorporate a low-power configuration using an AC-coupled passive continuous time linear equalizer (CTLE), and employing an onchip $V_{tt}$ generator (Vttgen) along with a suitably bandwidth-extended resistive termination network (RxZ) or terminator.

The receiving interface 101 can provide a single-ended analog signal to drive a sample and hold (S/H) circuit 103. Some implementations of the S/H circuit 103 incorporate CMOS transfer gates. Such a configuration can sample an analog input voltage with a wide rail-to-rail range, e.g., from (Vss−Vtn) to (Vdd+Vtp). In addition, the transfer gate impedance can be sufficiently low to allow the voltage on the output capacitance to settle well before the end of the φ clock phase. To compensate for the φ and φb clock's asymmetric noise-coupling due to mismatches between NMOS and PMOS miller capacitances, cross coupled miller counter-capacitances may be employed to reduce clock noise injection onto the held voltage.

Figure 2A:
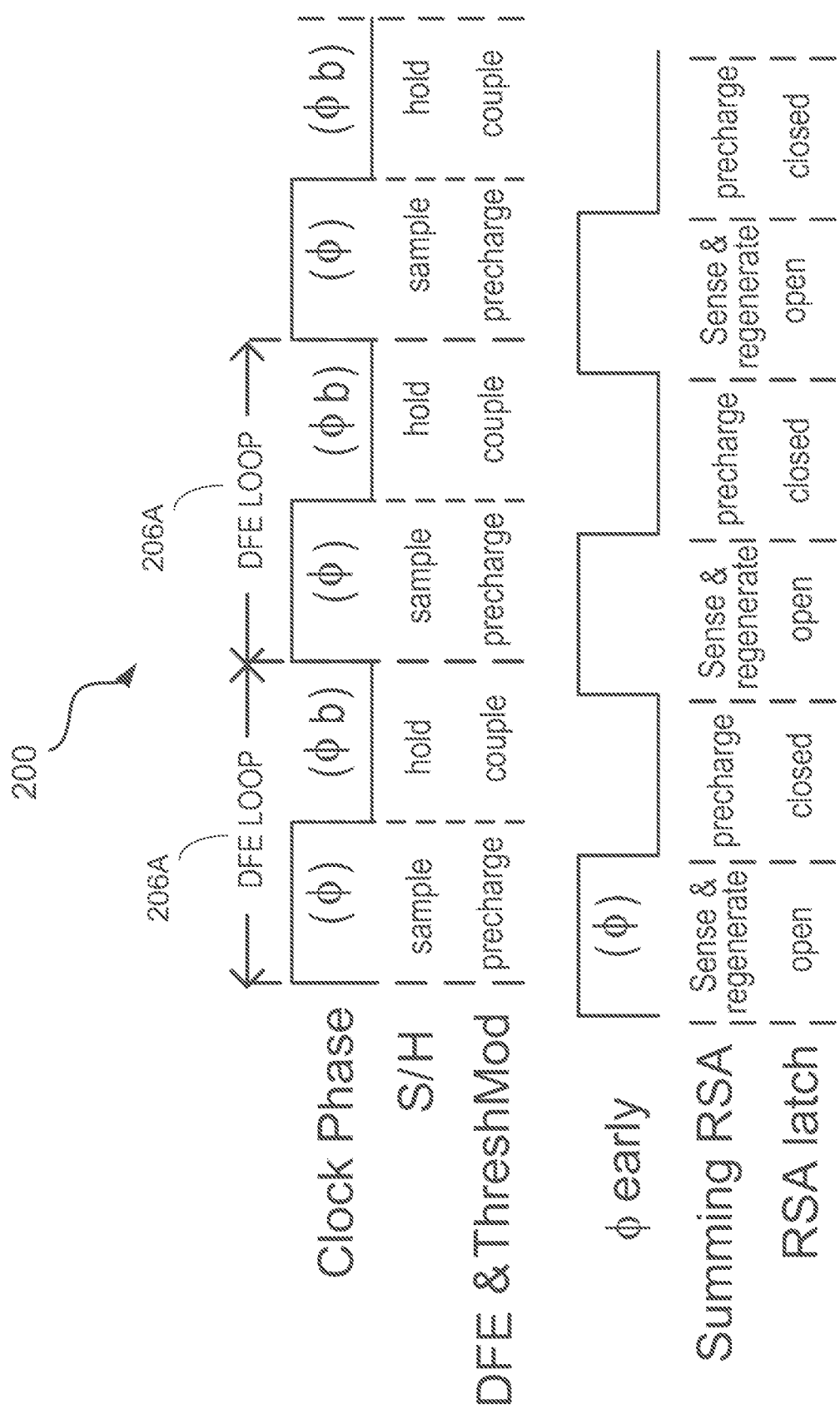
FIG. 2A shows an example of a timing diagram for the examples of the receiver equalizers of FIGS. 1A to 1D.

FIG. 2A shows a timing diagram that includes the φ clock phase as the sample phase. During the subsequent φb clock phase, the sampled voltage can be held at high impedance. This is indicated as the hold phase in FIG. 2A. A new symbol is processed every clock cycle without interleaving across multiple cycles of S/H in this depiction. High baud rate (e.g., 24 Gbaud or higher) systems require a short duration of φ and φb, which can result in a leakage effect of the disabled high speed transmission gate during φb if made to hold the voltage across multiple cycles. Here, baud (or Bd) refers to a unit for symbol rate or modulation rate in symbols per second or pulses per second. For example, baud can refer to the number of distinct symbol changes (signaling events) made to the transmission medium per second in a modulated signal or a bd rate line code.

Returning to FIG. 1A, the S/H circuit 103 has an input terminal 103A and an output terminal 103B. The input terminal 103A of the S/H circuit 103 receives the analog input signal from the receiving interface 101. The output terminal 103B of the S/H circuit 103 is coupled to a common node 103C. In effect, the output terminal 103B (and the common node 103C) can be capacitively coupled, e.g., by a capacitor 103D, to the prevailing ground reference or return path, where the capacitor 103D includes the distributed wire and circuit capacitances of all loads coupled to common node 103C.

The S/H circuit 103 can perform and complete operations in cycles. The cycles are run at a sample rate. In some cases, the sample rate can be 24 Gbaud or higher. Each clock cycle includes a sample phase and a hold phase, e.g., a single sample phase and a single hold phase. The S/H circuit 103 is configured to track the analog signal onto the S/H output terminal 103B during the sample phase and to generate a high impedance on the S/H output terminal 103B during the immediately subsequent hold phase. This high impedance enables the sampled analog output voltage to be modulated by other components coupled to common node 103C during the hold phase.

Receiver equalizer 100 further includes a data slicer 106 having a slicer input terminal 106A coupled to the common node 103C such that the data slicer 106 is directly coupled to and driven by the output terminal 103B of the S/H circuit 103. Two components are considered to be "directly coupled" if there is no intervening component between the connected terminals that would introduce delay, apart from parasitics such as wiring RLC. Moreover, in such a directly coupled configuration, the electrical connection between the terminals of two components can be such that both terminals are always at substantially the same voltage, e.g., no intervening switches.

The data slicer 106 outputs a digital signal in a serialized bit stream resulting from a comparator operating on the voltage signal at common node 103 and a comparator offset voltage. The comparator can include a clocked comparator. In some cases, the terms of "data slicer" and "comparator" may be used interchangeably. The data slicer 106 can also include a latch, for example, a flip-flop (FF) latch or may integrate the synchronous state element functionality into the slicer without instantiating a discrete latch component. The data slicer implementation can include a synchronous sense amplifier with an integrated latch function. No discrete latches or flip-flops are needed in this data slicer implementation. Yet, the data slicer functionally behaves as though the combination RSA and latch is a flip flop whose operative input is an analog input. The bit stream output from the data slicer 106 can couple to, for example, additional FF latches 107 and 108 that are arranged in series.

Receiver equalizer 100 also includes data-driven charge coupled DAC assembly 105, which as illustrated includes multiple digital-to-analog convertors (DACs), with one DAC 109 for each respective latch. The DAC assembly 105 includes a DFE-tap input terminal 105A for each DAC, and a DFE-tap output terminal 105B.

Each input terminal 105A is configured to receive a digital signal, i.e., a bit from the bit stream output, from a digital output of the data slicer 106 or from a latch in the series of latches 107, 108, and provide that digital signal to an associated DAC. For example, a first DAC 109A has an input terminal that receives serialized signal $D_{-1}$ directly from the slicer 106, i.e., with no further intervening latches or delay components. Each additional DAC, such as DAC 109B and DAC 109C, has respective input terminals that receive, as illustrated, the latched digital signals $D_{-2}$ and $D_{-k}$ from a respective subsequent flip-flop (FF) latch 107 and FF latch 108 in the sequence of FF latches. Although multiple latches are illustrated in series, for example, FF latches 107 and 108, some implementations may include only a single DAC which receives the serialized digital signal directly from slicer 106. The number of taps can vary from one to dozens or more. Some implementations incorporate a floating assignment where a portion of the FF latches in the series can be configured to connect to (or disconnect from) the DACs. The configuration can be static or dynamic (e.g., reconfigurable). Moreover, loop-unrolled implementations can speculate an output based on each possible combination, then multiplex out the selection based on that tap's latched data. In these loop-unrolled implementations, DACs are not involved for such taps. Hence the number of FFs may likewise not match the number of DACs for loop-unrolled taps.

Each DAC 109 has an output terminal that is directly coupled to the common node 103C. FIG. 1A illustrates a single output terminal 105B for the DAC assembly 105 because the output terminals of all the DACs 109 are connected to the common node 103C, thus there could be multiple output terminals connected in parallel to the common node 103C.

Each DAC can include a plurality of capacitor modules 109M, shown in an extremely simplified format in FIGS. 1A-1D, and logic components 109L. The logic components 109L provide an interface of the data-driven charge-coupled DAC to the incoming digital signal. The plurality of capacitor modules 109M in each DAC 109 are configured to be pre-charged while imposing a high impedance state to common node 103C during the φ clock phase, such that the DFE output terminal 105B tracks an output voltage on the output terminal 103B of the S/H circuit 103 during the sample phase.

Figure 1B:
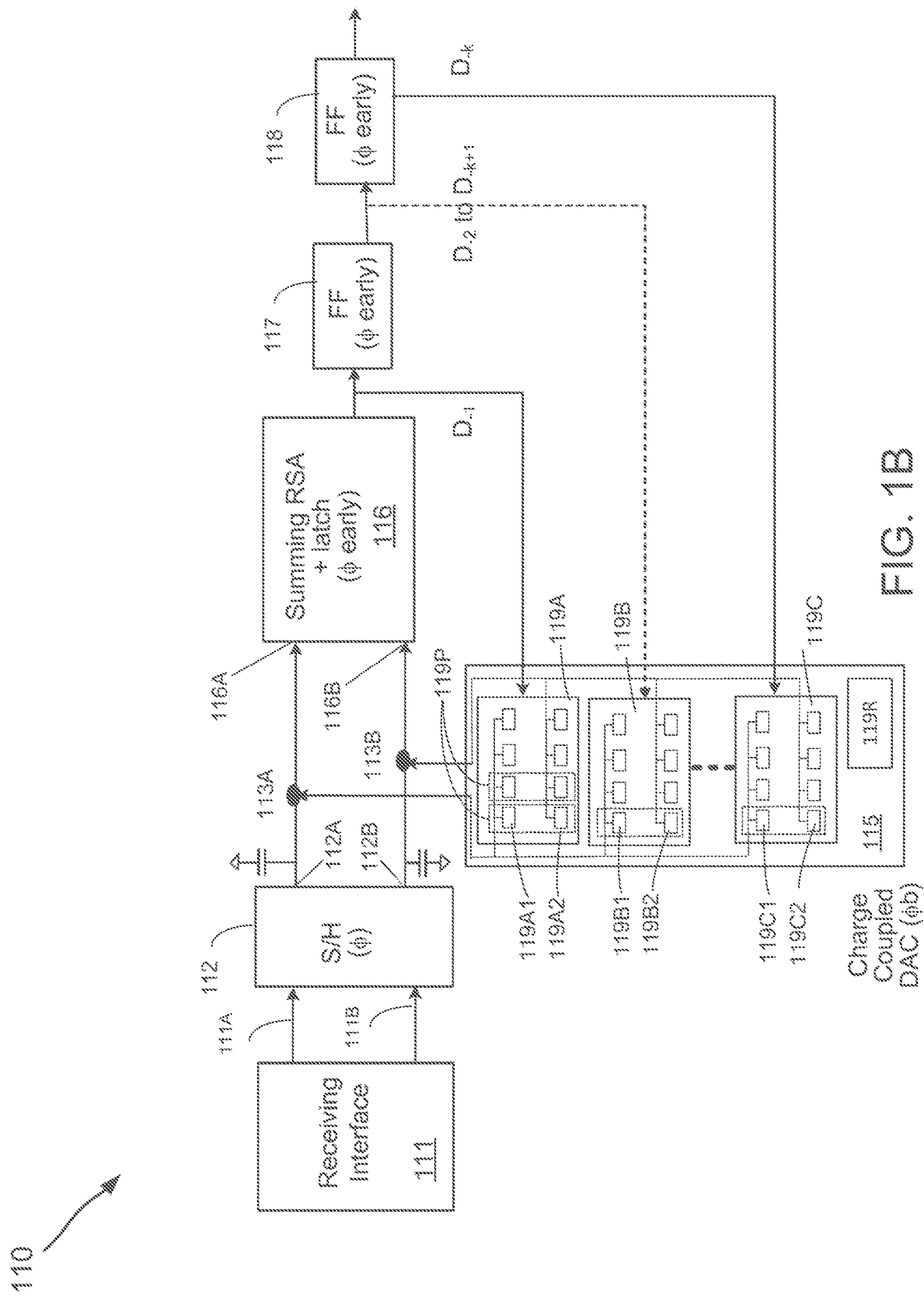
FIG. 1B illustrates another example of a receiver equalizer that incorporates a charge coupled DFE loop for a differential signal.
Figure 1C:
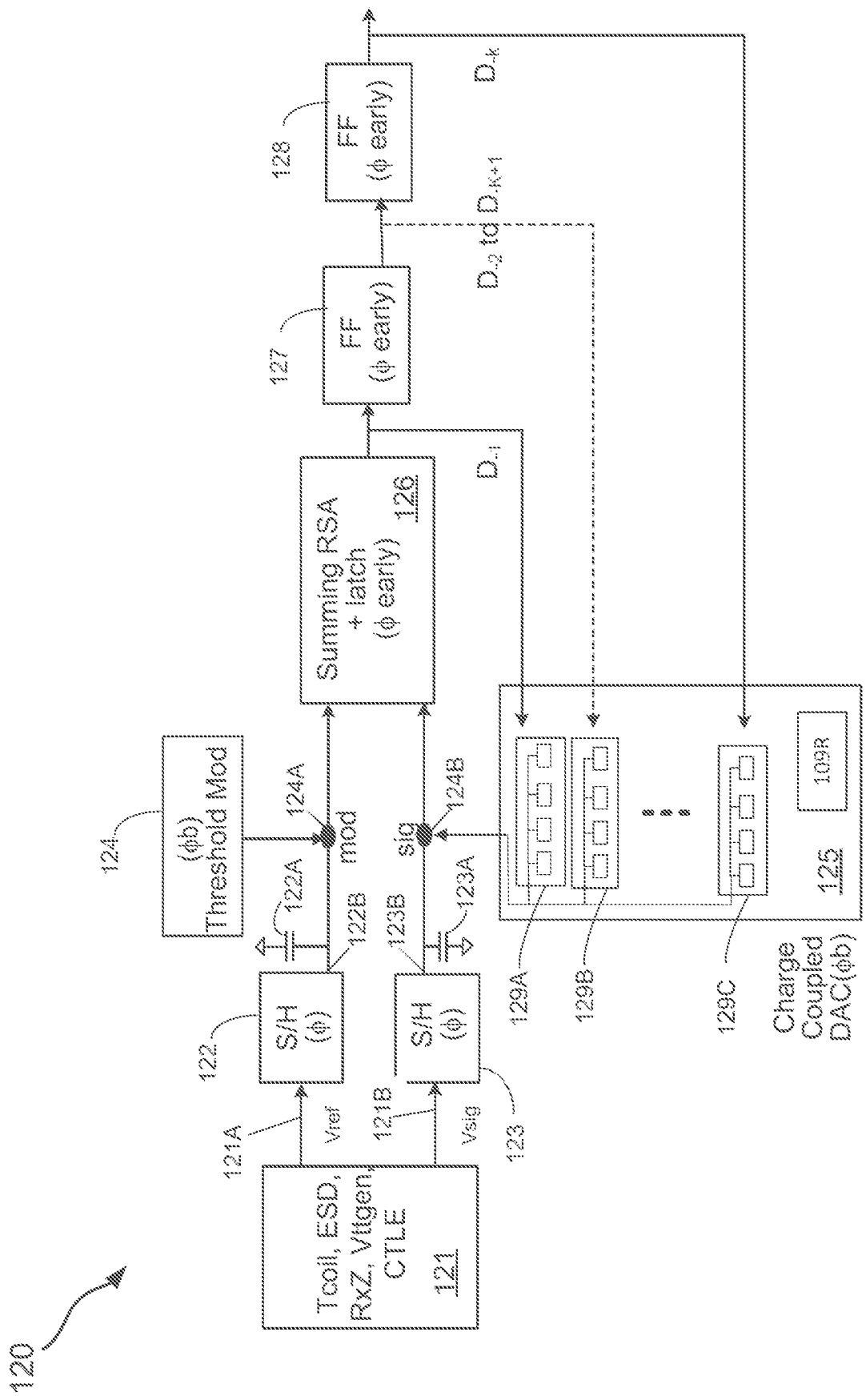
FIG. 1C illustrates yet another example of a receiver equalizer that incorporates a charge coupled DFE loop for a bifurcated configuration that including a reference voltage and a single-ended signal.
Figure 2B:
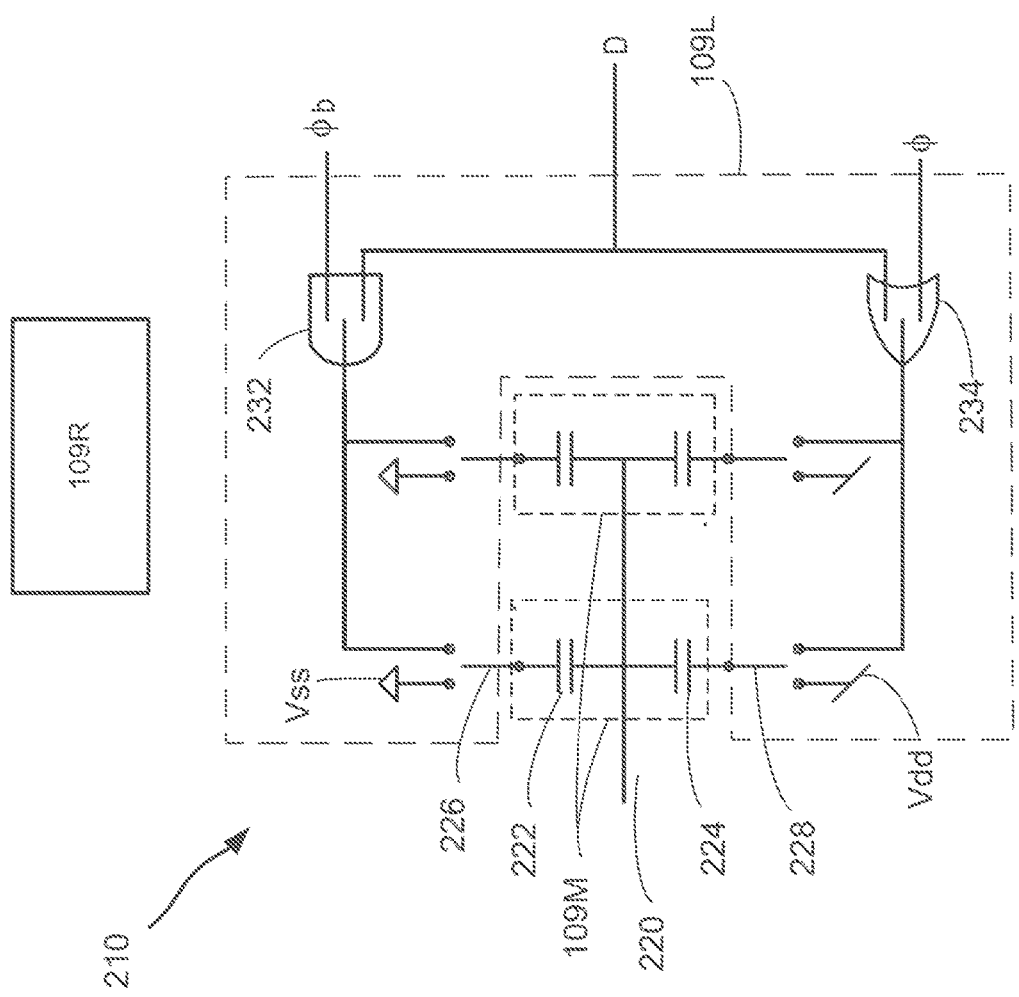
FIG. 2B shows an example of a digital to analog converter (DAC) structure.

FIG. 2B illustrates an example configuration for a DAC 210, which can provide the DAC 109 of FIG. 1A (or a DAC 125 of FIG. 1C). The DAC 210 includes multiple capacitor modules 109M, each of which includes a first capacitor 222 and a second capacitor 224. The first capacitor 222 and second capacitor 224 within a module 220 have the same capacitance, but the capacitors of different modules can have different capacitances. Each of the first capacitor 222 and second capacitor 224 have one terminal directly coupled to the common node 103C and another terminal connected to a switch 226 or 228. FIG. 2B illustrates two capacitor modules for simplicity. In binary implementations, if a 10-bit DAC is used, the DAC can have 10 modules grouped in a binary scale, which can result in a total of 1023 sets of least significant bit (LSB) capacitors. On the other hand, if a 10-bit DAC is thermometer coded, there can be 1023 modules grouped in identical scale (rather than binary). In pulse amplitude modulation 4-level (PAM4) implementations, there can be 984 LSB modules in parallel on each common node in the data path, from an assembly of 48 parallel DACs, the largest of which can be a 6-bit binary-encoded DAC. In addition, although FIG. 2B illustrates the first capacitor 222 and second capacitor 224 as single capacitors, each capacitor could be provided by a set of one or more capacitors connected in parallel.

The respective logic components 109L of each DAC receive the digital signal D and control the voltages applied to the plurality of capacitor modules in each DAC based on the digital signal. In particular, when the logic components toggle a voltage on the plurality of capacitor modules, charge is capacitively coupled to or from the first common node 103C during an immediately subsequent hold phase so that the capacitively coupled charge modulates the analog output voltage at the output terminal 103B during the hold phase.

An example of circuitry to provide logic components 109L is shown in FIG. 2B. An AND gate 232 receives as inputs the digital signal D and an inverted clock signal ϕb that is high during the hold phase and low during the sample phase. An OR gate 234 receives as inputs the digital signal D and a clock signal ϕ that is high during the sample phase and low during the hold phase. The AND gate 232 and OR gate 234 can be collectively referred to as CMOS logic. Each switch 226 connects the first capacitor 222 to either the output of the AND gate 232 or to a static low voltage Vss, e.g., ground. Similarly, each switch 228 connects the second capacitor 224 to either the output of the OR gate 234 or to a static high voltage, e.g., Vdd. The positions of both switches 226, 228 for a given capacitor module 109M are set by a common coefficient bit which can be stored in a register 109R. Thus the register 109R stores a plurality of coefficient bits, one for each capacitor module 109M. The coefficient bits can be set by an adaptation logic controller, a state machine, or a microcontroller. Values for the coefficient bits can be selected by the logic controller, state machine, or microcontroller based on the series of values in the digital signal, as well as other inputs. The coefficient values effectively configure the net capacitance of DAC 210, which in turn determine the net charge coupled to common node 103C.

If a coefficient bit sets the switches 226, 228 to connect the capacitors 222, 224 to the static voltages Vdd/Vss, the capacitors simply function as a static capacitance load, regardless of ϕ or ϕb clock phases. As such, the capacitors would not couple charges in either positive or negative direction. On the other hand, if the coefficient bit sets the switches to connect the capacitors 222, 224 to the CMOS logic, then the capacitors will have a dynamic action that depends on the digital data. During clock phase ϕ=1, the AND gate 232 pre-charges the first capacitor 222 to the Vss and the OR gate 234 pre-charges the second capacitor 224 to Vdd. As such, the statically configured versus the dynamically driven voltages are indistinguishable during this pre-charge phase. In preparation for the next phase, the digital signal D can toggle and settle during this phase without consequence. However, during clock phase ϕ=1, one of two scenarios can exist: (i) the AND gate switches from Vss to Vdd (if D is high) so that Vdd is applied to the first capacitor 222, or ii) the OR gate switches from Vdd to Vss (if D is low) so that Vss is applied to the second capacitor 224. In either case, the voltage on the other capacitor remains static due to the mutual exclusivity. This results in symmetric but counter-directional charge coupling to common node 103C as a function of digital signal D, the coefficients, and the clock phases.

As noted above, the DFE can include a control loop that sets the values for the coefficient bits in order to determine the amount of charge to couple into the common node 103C. However, this circuitry configuration keeps the signal path of the digital data (for the purpose of controlling triggering of a transition) outside of this control loop up until the end of the sample phase ϕ. Thus, coefficient updates, if any, should commence and settle during this phase.

In some implementations, the logic components 109L can then apply a coupling function for each data-driven charge coupling DAC 109 such that analog voltage outputs from these data-driven charge coupling DACs are linearly summed according to the coupling function. The coupling function can include as inputs one or more of a coupling direction, a coupling intensity, or a coupling gating. These implementations can include corresponding functional logic such as XOR gates and complex gates after the latches connected in series starting from the digital output of the data slicer 106.

Returning to FIG. 1A, receiver equalizer 100 includes a signal loop capable of achieving a single-cycle operation. This signal loop begins at the output 103B of S/H circuit 103. The signal loop includes data slicer 106 (representing a summing RSA and latch block), and charged coupled DAC assembly 105 which includes a plurality of switchable DACs 109A, 109B, and 109C. In some implementations, the signal loop may further include a series of flip-flop (FF) latches (107 to 108). The charge coupling DAC assembly 105 can thus dynamically couple a scaled and feedback-dependent charge to common node 103C. As illustrated, cycle-registered versions of the resolved data (e.g. up to $D_{-k}$ after k−1 latency of D-flipflops) can be included in the feedback to process higher DFE tap positions. In other words, resolved data from previous cycles, as latched in the series of k-tap flip-flop latches, can be provided as feedback in the same cycle or unit interval (UI) to common node 103C through charge coupled DAC assembly 105.

While FIG. 1A is directed to a single-ended implementation, receiver equalizer 110 of FIG. 1B illustrates a differential implementation in which receiving interface 111 generates a differential signal for input terminals 111A and 111B of a S/H circuit 112. In some cases, receiving interface may generate a single-ended signal while the S/H circuit 112 generates a differential output to drive the rest of the receiver equalizer. As illustrated, S/H circuit 112 provides a pair of differential output at output terminals 112A and 112B. The two output terminals 112A and 112B are respectively directly connected to two common nodes 113A and 113B. Each output terminal 112A and 112B can be capacitively coupled to the prevailing ground reference or return path, where capacitors 112A and 112B consist of the distributed wire and circuit capacitances of all loads coupled to common nodes 113A and 113B respectively. The S/H circuit 112 tracks the analog signal onto the S/H output terminals 112A and 112B during the sample phase and generates a high impedance on the S/H output terminals 112A and 112B during the immediately subsequent hold phase to enable the sampled analog differential output voltage to be modulated by other components during the hold phase at nodes 113A and 113B.

As illustrated in FIG. 1B, an equalizer circuit 110 further includes a data slicer 116 having two input terminals 116A and 116B respectively coupled to the two common nodes 113A and 113B such that the data slicer 116 is directly coupled to and driven by the output terminals 112A and 112B of the S/H circuit 112. The control logic is not illustrated in FIG. 1B for ease of illustration.

Similar to FIG. 1A, equalizer circuit 110 of FIG. 1B includes a signal loop capable of achieving a single-cycle operation. This signal loop begins at the outputs 112A and 112B of S/H circuit 112. The signal loop includes the data slicer 116 (including summing RSA and latch), and charged coupled DAC assembly 115 which includes input terminals, output terminals, a plurality of DACs (e.g., 119A, 119B, and 119C), and logic components.

Each DAC can include a plurality of switchable capacitor modules arranged in differential pairs 119P. By way of illustration, DAC 119A can include a first pair of capacitor modules 119A1 and 119A2. Here, the first pair 119A1 and 119A2 can have a pair of input terminals to receive serialized logic signal $D_{-1}$ directly from the slicer 116, i.e., with no intervening latches or other delay components. DAC 119B can include a second pair 119B1 and 119B2, which can also have a pair of input terminals to receive serialized logic signal $D_{-2}$ from flip-flop (FF) latch 117. As illustrated in FIG. 1B, DAC 119C can include a third pair 119C1 and 119C2, which can also have a pair of input terminals to receive serialized logic signal $D_{-k}$ from flip-flop (FF) latch 118. Indeed, each FF latch that corresponds to a particular tap of delay can be connected to a corresponding differential pair of switchable capacitor module.

Each pair of switchable capacitor module can be pre-charged such that the output terminals track an output voltage on the output terminals 112A and 112B of the S/H circuit 112 during the sample phase. The logic components can control voltages applied to the plurality of DACs 119A to 119C based on the logic signal received. For example, when the logic components toggle a voltage on the plurality of capacitor modules (119A to 119C), charge is capacitively coupled to or from the first common node 113A and 113B during an immediately subsequent hold phase so that the capacitively coupled charge modulates the analog output voltage at the output terminal 112A and 112B during the hold phase. While the specific logic can vary among the implementations, the toggling event, if it occurs, then causes a switchover which is accomplished within the same cycle or unit interval as the input is received.

Figure 3:
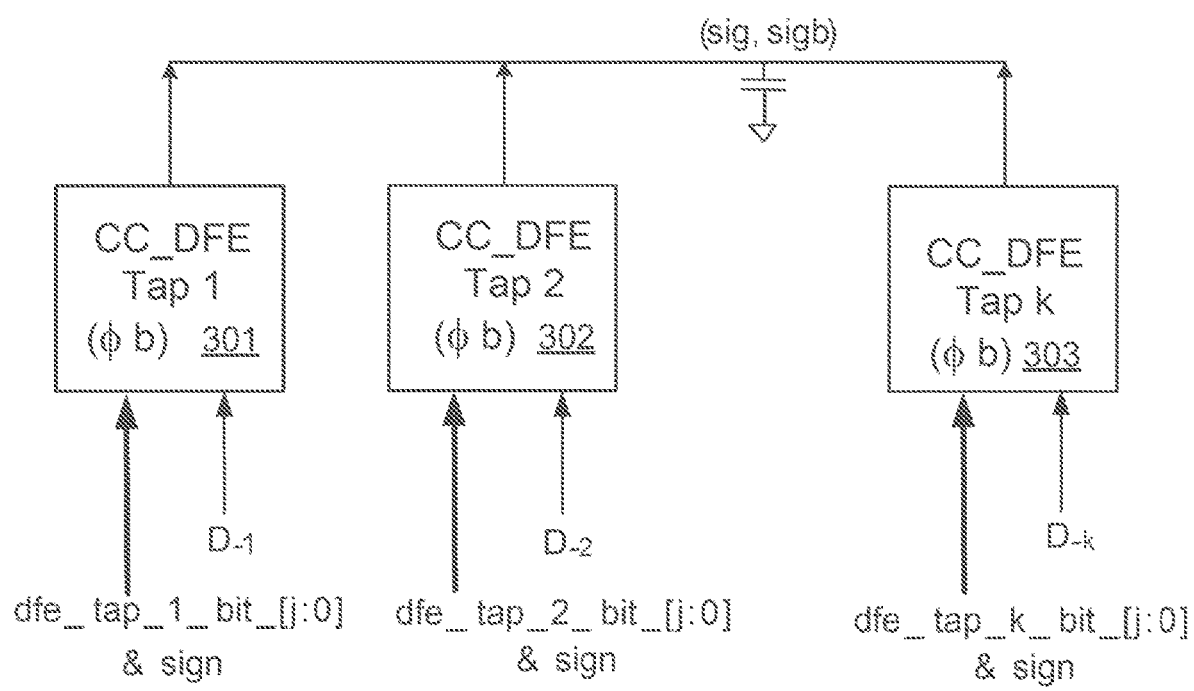
FIG. 3 illustrates a diagram of charge coupled DFE tap components for the receiver equalizer of FIG. 1A to 1D.
Figure 4A:
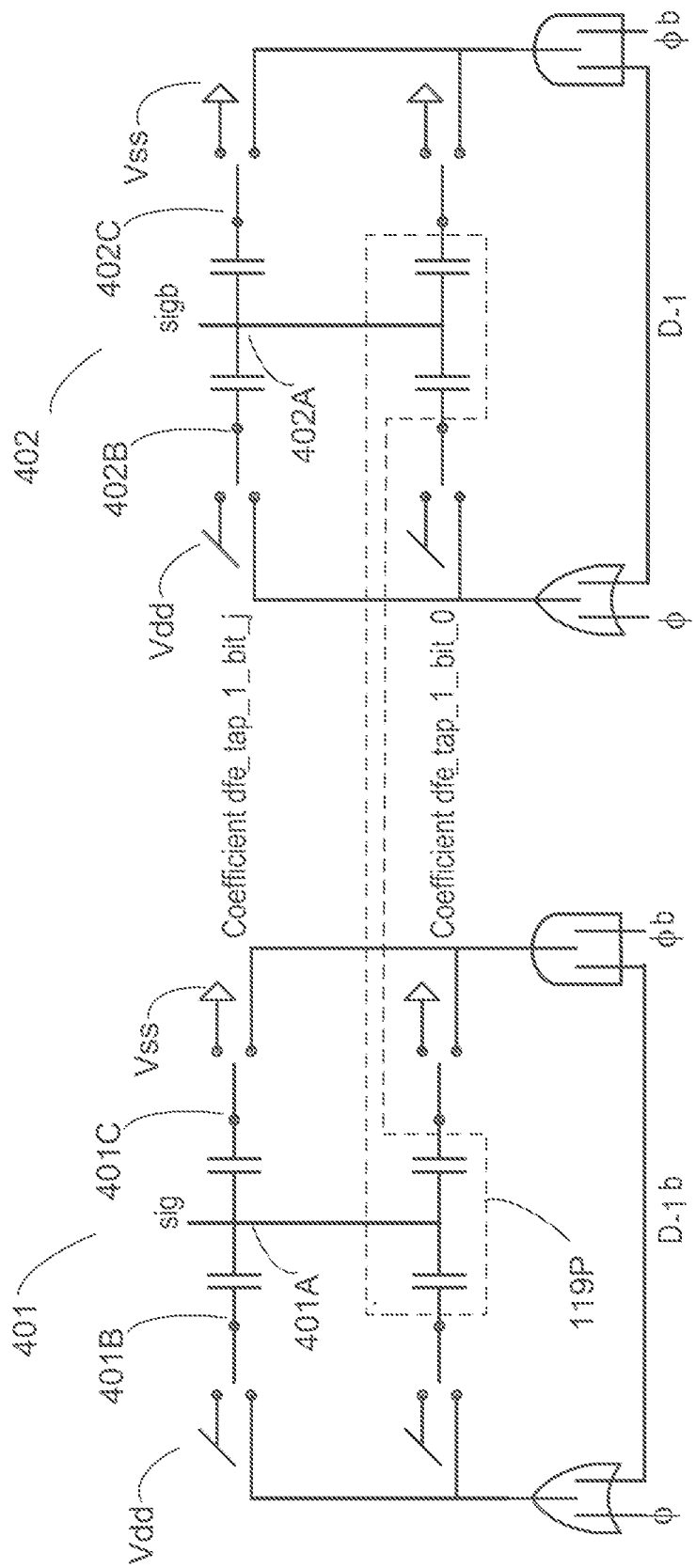
FIG. 4A illustrates an example of a charge coupled DFE tap component configured in differential capacitor modules for the receiver equalizers of FIGS. 1B and 1D.
Figure 4B:
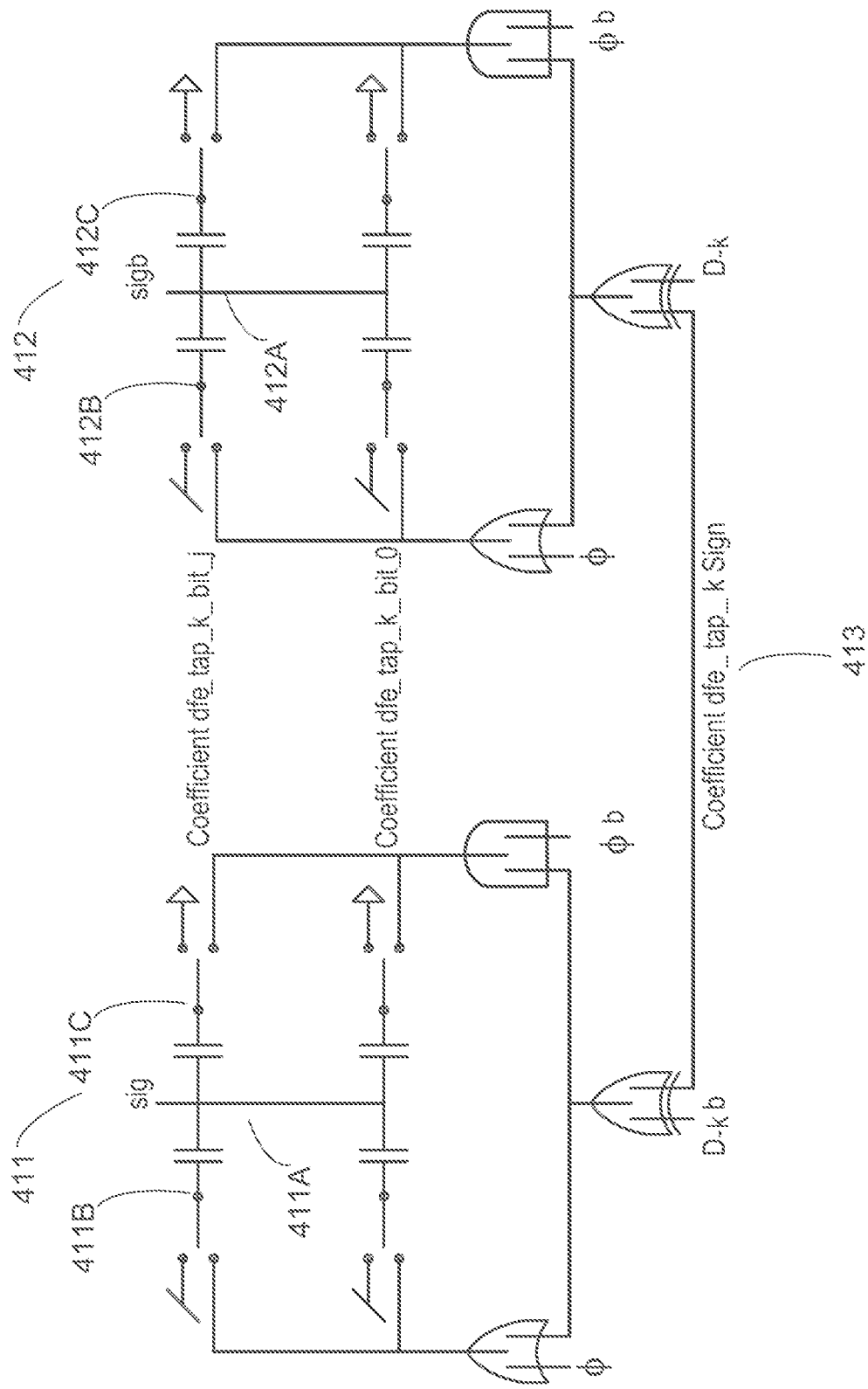
FIG. 4B illustrates another example of a charge coupled DFE tap component configured in differential capacitor modules for the receiver equalizer of FIGS. 1B and 1D.

Referring to FIGS. 3, 4A, and 4B, some implementations can operate on cycle-registered versions of the resolved digital data (e.g. from $D_{-1}$ up to $D_{-k}$ after a latency of 1 to k D-flipflops) in the feedback through a multitude of taps. Here, each tap corresponds to a DAC structure that includes a set of capacitor modules. As illustrated in FIG. 3, tap 1 (301), tap 2 (302), and tap k (303) may each include a DAC structure to receive a respective digital signal (e.g., $D_{-1}$, $D_{-2}$, up to $D_{-k}$) and the corresponding weighting factor and directional sign, if applicable, for this tap. The control logic can include a NOT gate to generate complementary signals $D_{-1b}$, $D_{-2b}$, up to $D_{-kb}$. Specifically, the resolved digital data from previous cycles, as latched in the series of k-tap flip-flop latches, can be provided as analog feedback in one cycle (or unit interval) to nodes 113A and 113B through charge coupling DAC assembly 115. As illustrated, this multiplicity of charge coupling DACs (including, for example, DACs 301, 302, and 303) can process k taps (from tap 1, tap 2, to tap k). For ease of illustration, the taps from tap 3 to tap k−1 are not shown. In this example, each DAC can include at least one pair of capacitor modules and integrates the respective contribution of charges onto the fixed load capacitance (e.g., 112A and 112B) when the ϕb clock phase commences, after the input signal has been sampled on to the same load capacitance during the immediately preceding ϕ clock phase.

FIGS. 4A to 4B respectively illustrates examples of DAC structures for tap 1 and tap k. The DAC structure for tap 1 includes switched capacitor network 401 for sig based on $D_{-1b}$ and switched capacitor network 402 for sigb based on $D_{-1}$. The coefficient sign in this illustration is fixed at a negative value, since a positive digital data D as latched from the previous cycle results in a higher sigb voltage and a lower sig voltage in the immediately subsequent cycle. The DAC structure for tap k includes switched capacitor network 411 for sig based on D-kb, and switched capacitor network 412 for sigb based on $D_{-k}$. Each DAC structure includes common terminals 401A (sig), 402A (sigb), 411A (sig), and 412A (sigb). The coefficient sign in this illustration is configurable based on dfe_tap_k sign 413. During the sample phase, half of the remaining terminals (e.g., terminal 401B and those for other tap 1 coefficient bits in switched capacitor network 401 for sig, terminal 402B and those for other tap 1 coefficient bits in switched capacitor network 402 for sigb, terminal 411B and those for other tap k coefficient bits in switched capacitor network 411 for sig, terminal 412B and those for other tap k coefficient bits switched capacitor network 412 for sigb) of the charge coupling capacitor network can be independently pre-charged at a static $V_{dd}$ voltage, and the other remaining half of terminals (e.g., terminal 401C and those for other tap 1 coefficient bits in switched capacitor network 401 for sig, terminal 402C and those for other tap 1 coefficient bits in switched capacitor network 402 for sigb, terminal 411C and those for other tap k coefficient bits in switched capacitor network 411 for sig, terminal 412C and those for other tap k coefficient bits in switched capacitor network 412 for sigb) can be independently pre-charged at static $V_{ss}$ voltage. Importantly, the pre-charge voltages on terminals of the charge coupling DAC assemblies 105, 115, 125, and 135 of FIGS. 1A-1D are independent of a decision feedback state that results from the prior cycle's RSA output state, and independent of a registered state from any previous cycle. Furthermore, $V_{dd}$ voltage and $V_{ss}$ voltage are used for illustration, but any set of two distinctly high and low static voltages can be used.

In more detail, FIG. 4A illustrates an example of a DFE component (e.g., a DAC structure) for tap 1 that provides output pins for {sig, sigb}, which respectively connects to identically-fashioned switched capacitor networks 401 and 402. Terminal 401A of the parallel-connected switchable capacitor network 401 does not physically disconnect from sig. Terminal 401A is an example of the common terminal to sig, as already discussed above. Terminals 401B and 401C of switched capacitor network 401 can either connect to CMOS logic or to static $V_{dd}/V_{ss}$ potentials, depending on the configuration of DFE coefficient bits for sig. Similarly, terminal 402A of the parallel-connected switched capacitor network 402 does not physically disconnect from sigb. Terminal 401B is an example of the common terminal to sigb, as already discussed above. Terminals 402B and 402C of capacitor network 402 can either connect to CMOS logic or to static $V_{dd}/V_{ss}$ potentials, depending on the configuration of DFE coefficient bits for sigb. The coefficient bits can be stored in register 119R, and values for the coefficient bits can be fixed, or can be selected by a logic controller, state machine, or microcontroller based on the series of values in the digital signal, as well as other inputs.

If the coefficient bit selects the $V_{dd}/V_{ss}$ static potentials, the capacitors simply function as a static capacitance load on sig or sigb, regardless of ϕ or ϕb clock phases. As such, the capacitors do not couple charges in either positive or negative direction to sig or sigb. However, the capacitance of this capacitors for this coefficient bit is not physically disconnected from sig or sigb because there is no disconnection-switch for the capacitors of the switched capacitor network at the common terminal for sig or sigb. This physical connection can effectively prevent charge-sharing glitches on {sig,sigb} should a switch on sig or sigb dynamically connect. The invariant capacitance on {sig,sigb} also enables a consistent delta-v resolution for the coefficient bit because delta-v is proportional to the ratio between the coefficient bit's capacitance and the invariant total {sig, sigb} capacitance.

On the other hand, if the coefficient bit selects CMOS logic, then during clock phase ϕ, the CMOS logic pre-charges the capacitors of capacitor networks 411 and 412 to the same $V_{dd}/V_{ss}$ potentials as if the static potentials were selected, rendering the statically configured versus the dynamically driven voltages indistinguishable during this pre-charge phase.

However, during clock phase ϕb, one of two scenarios can exist: (i) the sig capacitor's logic-driver dynamically switches from $V_{dd}$ to $V_{ss}$ (leaving the other $V_{ss}$ capacitor static at $V_{ss}$) while the sigb capacitor's logic-driver dynamically switches from $V_{ss}$ to $V_{dd}$ (leaving the other $V_{dd}$ capacitor static at $V_{dd}$); or (ii) the sigb capacitor's logic-driver dynamically switches from $V_{dd}$ to $V_{ss}$ (leaving the other $V_{ss}$ capacitor static at $V_{ss}$) while the sig capacitor's logic-driver dynamically switches from $V_{ss}$ to $V_{dd}$ (leaving the other $V_{dd}$ capacitor static at $V_{dd}$). In scenario (i), a negative differential DFE voltage is coupled upon {sig, sigb}. In scenario (ii), a positive counterpart is coupled upon {sig, sigb}. In all cases for these differential implementations, the common mode voltage defined as the average of {sig, sigb} remains constant, which significant benefits common mode noise rejection for differential slicer 116, differential DAC assembly 115 and differential S/H 112 blocks. Moreover, these differential implementations can effectively double the output DFE voltage by virtue of being able to simultaneously and symmetrically pull down or pull up on each of sig or sigb, as distinguished from only pulling down one of sig or sigb.

As illustrated in FIG. 4B, some implementations can contain logic that applies the coefficient sign 413 to the digital data input that feeds into switched capacitor networks 411 and 412. Further referring to FIG. 4B, a DAC implementation for tap k of the charge coupling DFE component is provided. This DAC implementation includes switched capacitor networks 411 and 412. As illustrated, the amount of voltage coupled to capacitors of switched capacitor networks 411 and 412 depends on the configuration of the coefficient bits "dfe_tap_k_bit_j" for the kth tap. For each tap on, for example, charge coupling DAC assembly 125, the number of coefficient bits may be equal to the number of individually selectable static versus dynamic groupings. In one configuration, the coefficients may be thermometer coded such that each selectable bit carries the same capacitance weight. This configuration harbors equal DFE voltage impact for each dynamically enabled coefficient bit, at the expense of the sheer number of coefficient bits. In another configuration, the coefficients may be binary or Gray coded, such that the selectable bits carry $2^n$ capacitance weights, which may minimize the number of coefficient bits. In yet another configuration, a combination of these two coding approaches may allow a continuous adaptation using, for example, thermometer coded coefficient bits, following initial DFE adaptation using binary or Gray coded coefficient bits. In a preferred embodiment, binary or Gray encoded schemes allow continuous adaptation by updating and settling the coefficients within the $\phi$ phase.

In various implementations, the output impedance of the CMOS logic of the charge coupled DAC assembly can be sufficiently low to be capable of driving the switched capacitors selected by the coefficient bits. A binary or Gray encoded grouping tends to minimize parasitic capacitance loads that may otherwise add an overhead to the dynamic driver. However, such coefficient bits may not be disturbed during $\phi b$ clock phase, and can only be updated during $\phi$ clock phase in the interest of preventing decoding glitches.

A binary encoded fixed-coefficient-sign configuration consistent with FIG. 4A can save one gate delay from the signal loop, while staying compatible with high-insertion-loss channels. The common mode voltage can be kept constant after coupling equal and opposite DFE charges on the differential output nodes, while the net output capacitance can be kept invariant regardless of the coefficient bit configuration. Alternatively, the coefficient sign can be logically factored into the feedback logic of FIG. 4B, to facilitate compensating for channel reflections and/or CTLE over-equalization as seen on $V_{diff}$.

While FIG. 1B illustrates a differential implementation in which receiving interface 111 generates a differential signal for input terminals 111A and 111B of the S/H circuit 112, FIG. 1C illustrates a receiver equalizer 120 in a single ended bifurcated implementation in which the receiving interface 121 generates a reference signal 121A and a single-ended signal 121B. The reference signal 121A feeds to one S/H circuit 122 while the single ended signal 121B feeds to another S/H circuit 123. The voltage Vref of the reference signal 121A can be the instantaneous receiver termination voltage Vtt generated within the receiving interface 121. The S/H circuit 122 generates an output at the output terminal 122B that is directly coupled to one mod node 124A, which is also a common node. The output terminal 122B can be coupled by capacitor 122A to the prevailing ground reference or return path, where capacitor 122A includes the distributed wire and circuit capacitances of all loads coupled to mod node 124A. This output can be modulated by a threshold modifying DAC assembly 124, e.g., an offset nulling DAC, at the mod node 124A, as explained in further detail below. The threshold-modifying DAC 124 also includes a plurality of capacitor modules and logic components.

Meanwhile, S/H circuit 123 generates an output at the output terminal 123B that is directly coupled to another common signal node 124B. The output terminal 123B can be coupled by another capacitor 123A to the prevailing ground reference or return path, where capacitor 123A includes the distributed wire and circuit capacitances of all loads coupled to signal node 124B, which is also a common node. The output of the output terminal 123B can be modulated by a charge coupling DAC assembly 125 at the signal node 124B. Similar to the implementations discussed in FIGS. 1A and 1B, a signal loop also exists in the implementation illustrated by FIG. 1C. This signal loop includes a data slicer 126 and a charge coupling DAC assembly 125 so that a resolved digital signal from the data slicer 126 can serve as feedback to node 124B. As illustrated in FIG. 1C, the charge coupling DAC assembly 125 can include switchable capacitor networks 129A, 129B, and 129C, each including an input terminal to receive a digital input. In this illustration, data slicer 126 is followed by a series of flip-flop (FF) latches (e.g., latches 127 and 128). The resolved digital signal of the data slicer 126, as well as instances of the resolved digital signal from previous clock cycles latched by the latches, are respectively coupled to switchable capacitor networks 129A, 129B, and 129C.

Figure 5:
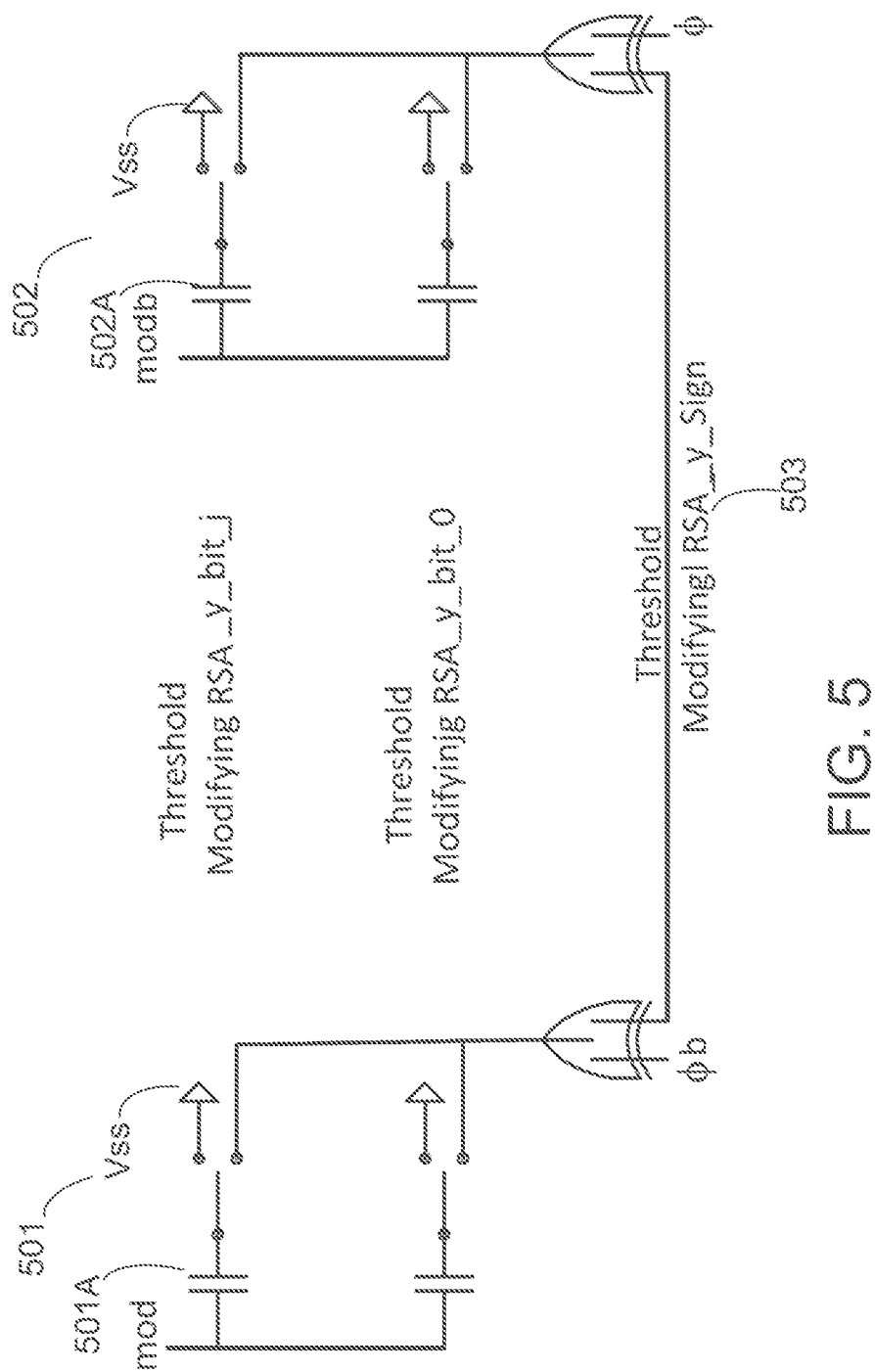
FIG. 5 illustrates an example of a charge coupled threshold modifier for the receiver equalizer of FIGS. 1A to 1D.

The aforementioned charge coupling method can also apply input-referred offset voltage compensation on mod 124A to remedy the downstream receiver sense-amplifier (RSA) and/or upstream analog amplifiers. For example, the charge coupling capacitor of the threshold modifying DAC assembly 124 can be pre-charged during the sample phase to track a reference output voltage on the output terminals of S/H circuit 122. Based on threshold modifying coefficients, the logic components of the threshold modifying DAC assembly 124 can operate on charge coupling capacitors to couple the charges to or from mod node 124A during the hold phase. In this context, the charge coupling DAC that apply compensation on mod node 124A may also be referred to as an offset nullifying DAC, or a threshold modifying DAC. Referring to FIG. 5, which illustrates one implementation of DAC assembly 124, the signed coefficient bit values are provided by switchable capacitors network 501 and 502. The offset sign 503 can initially be found, for example, during a calibration procedure. While FIG. 5 illustrates one arrangement of capacitor network for a threshold modifying DAC where the threshold modifying coefficients do not change after the initial calibration, the capacitor network illustrated in FIGS. 4A and 4B can also be used for threshold modifying DACs where the threshold modifying coefficients (including the sign) can be dynamically updated. In practice, a threshold modifying DAC assembly can include the implementation of FIG. 5 and the implementation of FIG. 4B in parallel.

To illustrate, during boot-up, a DAC assembly of FIG. 5 (incorporating switchable capacitor networks 501 and 502) can implement an initial threshold modifying calibration and then lock in the threshold modifying coefficients for a subsequent mission mode. In more detail, during calibration, each time the threshold modifying coefficients change, the initial threshold modifying results are ignored because decoding glitches ruin these initial results for the DAC assembly implementation of FIG. 5. However, subsequent results are valid and used, because the threshold modifying coefficients are stable and valid in those later cycles. The calibration procedure can thus proceed and the implementation can be glitch-tolerant because the initial results, albeit invalid, can be discarded. In the subsequent mission mode, since the threshold modifying coefficients do not change, pre-charge voltages are settled and known during $\phi$ phase. Meanwhile, the parallel DAC assembly of FIG. 4B have initial coefficients that are all zero. As the offsets drift over time (e.g., due to temperature and/or supply variations), this parallel DAC assembly can modify the thresholds by having the coefficients updated by the controller, or state machine, or processor, using the adaptive nulling algorithm previously mentioned.

In contrast with charge coupling DAC assembly 125, the threshold modifying DAC assembly 124 need not prepare two sets of pre-charged states prior to selecting which state to transition. In more detail, compared to switchable capacitors networks 401, 402, 411, and 412 from FIGS. 4A and 4B, capacitor 501A in switchable capacitors network 501 is not paired with another capacitor back-to-back to share a threshold mod bit. Instead, for each threshold mod bit, only one capacitor (or set of capacitors to provide a desired total capacitance) is provided to operate in one direction, as illustrated in FIG. 5. Similarly, capacitor 502A in switchable capacitors network 502 is not paired with another capacitor back-to-back to share a threshold modb bit. Given that the sign and magnitude of the threshold modifying coefficient are settled during the $\phi$ clock phase, the appropriate pre-charge potential can be established at the charge-coupling capacitor nodes. During the subsequent $\phi$b clock phase, a logic transition can accomplish the desired charge coupling action onto mod. In various implementations, the charge coupling does not involve a decision function within the same cycle that includes data slicer 126 or forward latches 127. Here, within the sample/hold cycles, $D_{-1}$-$D_{-k}$ need not enter as inputs to the offset modifier block functions. However, after several cycles, the resolved data stream (from the flip-flop latches) may arrive at offset calibrator which may then use the information to update the coefficients. Although the calibration and adaptation can be slow in terms of number of cycles, the updating/adapting coefficients can involve the data from slicers and flip flop latches.

A variable-coefficient threshold modifying configuration can be binary encoded when statically applied during mission mode. As with the configuration for charge coupling DAC assembly 125 of FIG. 1C, the scalar weights of threshold modifying coefficient bits directly relates in proportion to the delta-voltage transition as well as the coupling capacitor's LSB value, and inversely relates to the net load capacitance as seen on mod.

Figure 1D:
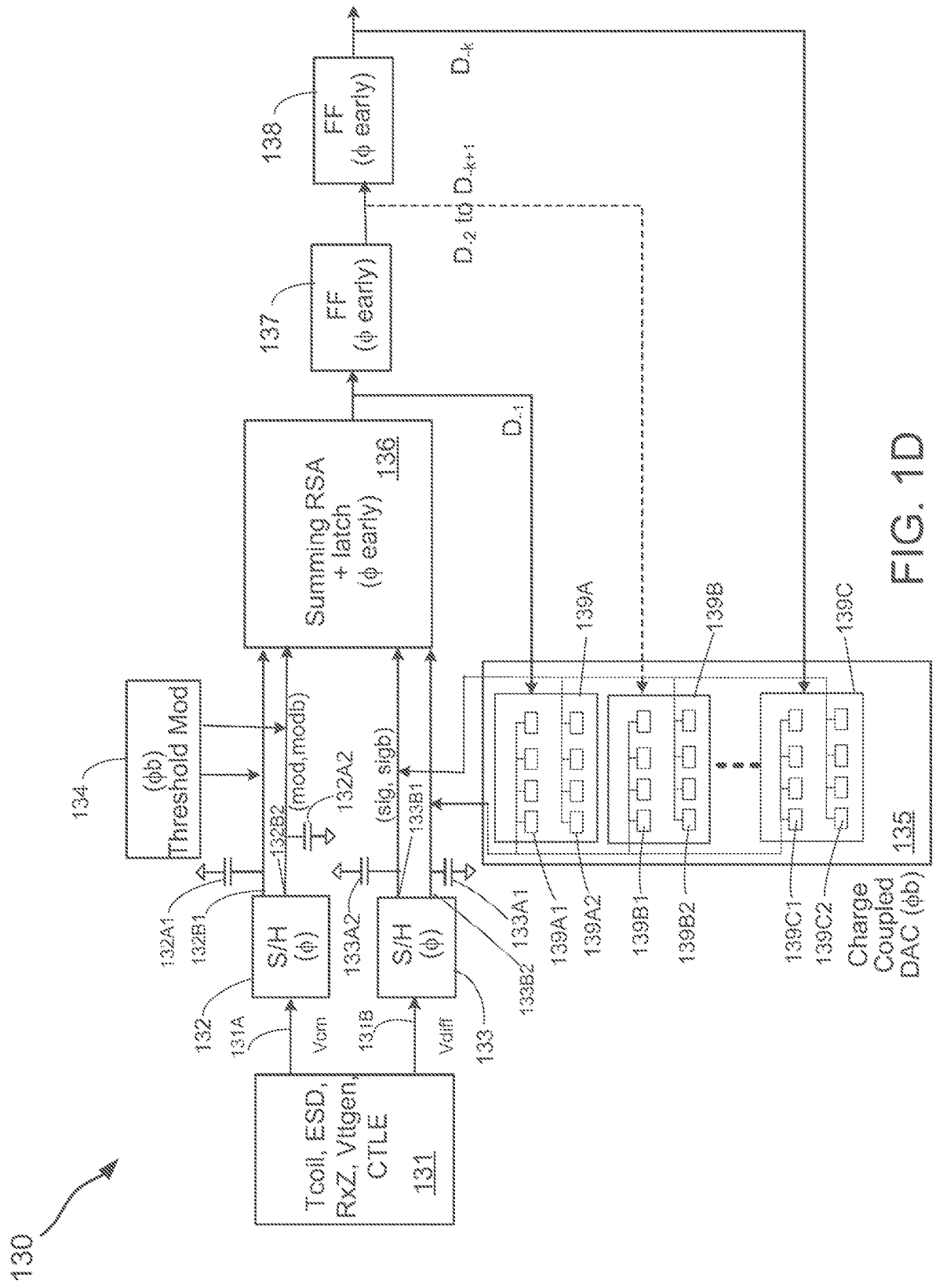
FIG. 1D illustrates yet another example of a receiver equalizer that incorporates a charge coupled DFE loop for a differential signal and a bifurcated configuration.

FIG. 1D further illustrates a receiver equalizer 130 in a differential implementation with bifurcation. As illustrated, receiving interface 131 generates a common mode voltage $V_{cm}$ (as a single wire shorted to both $V_{cm+}$ and $V_{cm-}$) as well as a difference voltage $V_{diff}$ (as a differential signal which includes $V_{diff+}$ and $V_{diff-}$). In short, both $V_{cm}$ and $V_{diff}$ are represented as differential analog signals. The voltage $V_{cm}$ of the reference signal 131A can be the instantaneous average of $V_{diff+}$ and $V_{diff-}$ as generated within the receiving interface 131.

As illustrated in FIG. 1D, the differential voltage output signal $V_{diff}$ and the instantaneous common mode voltage output signal $V_{cm}$ (as distinguished from average $V_{tt}$) are provided respectively to two sample and hold (S/H) circuits 132 and 133. Both S/H circuits 132 and 133 can generate differential outputs. In some cases, the differential signals from output terminals 132B and 133B are summed onto a receiving sense amplifier (RSA), which can include multiple transistors configured to sense low-amplitude signals on output terminals 132B and 133B, and amplify the small voltage swing to recognizable logic levels for subsequent processing.

Each differential RSA input can employ cross coupled miller counter-capacitance to null the capacitive miller effect. For context, the Miller effect generally refers to the increase in the equivalent input capacitance of an inverting voltage amplifier due to amplification of the effect of capacitance between the input and output terminals. Specifically, we refer to the Miller effect on a transistor as the modulation of an input gate voltage by the inverted polarity excursion on its drain output, due to the presence of a parasitic "Miller capacitance" between the input and the output. Compensation is desirable because the differential inputs 132B and 133B are still at high impedance when the RSA begins its inverting sense operation, hence the input voltage may be differentially coupled and thus disturbed by the RSA's internal sensing operation by way of the Miller effect. Since an internal symmetrically opposite voltage is available in the RSA, a purposely matched Miller capacitance can be employed to precisely counter the original parasitic Miller capacitance on each differential input. This RSA miller compensation technique can apply to the differential configurations of FIG. 1B and FIG. 1D.

FIG. 1D particularly shows the output terminals 133B1 and 133B2 of S/H circuit 133 are capacitively coupled by capacitors 133A1 and 133A2 to the prevailing ground reference or return path, where capacitors 133A1 and 133A2 include the distributed wire and circuit capacitances of all loads coupled to common nodes sig and sigb. The output terminals of S/H circuit 132 are also capactively coupled by capacitors 132A1 and 132A2 to the prevailing ground reference or return path, where capacitors 132A1 and 132A2 include the distributed wire and circuit capacitances of all loads coupled to common nodes mod and modb. Each of the signal paths from the S/H circuits 132 and 133 then simultaneously merge with the output of two respective modulation functions. In the case of the $V_{diff}$ path (from the capacitive output 133A of S/H circuit 133, which can include a differential pair of branches for sig and sigb), the modulation output comes from a charge coupled DAC assembly 135, as explained above in association with FIG. 1B. In the case of the instantaneous $V_{cm}$ path (from the capacitive output 132A of S/H circuit 132, which can also include a differential pair of branches for mod and modb), the modulation output is provided by a charge coupled threshold modifying DAC assembly 134 (e.g. threshold modifying DAC 134), as explained above in association with FIG. 1C.

Here, the $V_{diff}$ path amounts to a signal loop capable of achieving a single-cycle operation. This signal loop begins at the capacitive output 133A of S/H circuit 133. The signal loop includes data slicer (summing RSA+latch block) 136, and charged coupled DAC assembly 135, which operates in a manner similar to DAC assemblies 105, 115, and 125. DAC assembly 135 likewise includes input terminals, output terminals, a plurality of switchable capacitor modules 139A to 139C, and logic components. The plurality of capacitor modules 139A, 139B, and 139C can be pre-charged in similar fashions, like switchable capacitor modules 109A to 109C, switchable capacitor modules 119A to 119C, and switchable capacitor modules 129A to 129C. As discussed above, FIGS. 4A-4B provide additional operating details of these switchable capacitor modules and logic components. In particular, each switchable capacitor modules 139A, 138B, and 139C is arranged in a differential pair including {139A1, and 139A2}, {139B1, and 139B2}, and {139C1, and 139C2}.

In some instances, the signal loop can additionally include a series of flip-flop (FF) latches (137 to 138). Moreover, DAC assembly 135 may include a first DAC to receive digital outputs from data slicer 136, a second DAC to receive digital outputs from FF latch 137 (which lags by two clock cycles relative to input signal at S/H circuits 132 and 133), a kth DAC to receive digital outputs from FF latch 138 (which lags behind by k clock cycles relative to input signal at S/H circuits 132 and 133). For ease of illustration, DACs for latches that correspond to the interim lags are not shown.

In this signal loop, separate sets of merged analog signal paths culminate in a summing RSA and latch function (RSA) at data slicer 136. As illustrated, the $V_{diff}$ signal, denoted in differential form as (sig, sigb), as well as the feedback signal from charge coupled DAC assembly 135, culminate in data slicer 136. While only the $V_{diff}$ path is involved in the signal loop as illustrated in FIG. 1D, the Van path still converges with the $V_{diff}$ path at the data slicer 136 in order to implement a threshold modification function which includes an input "common mode rejection" feature.

Specifically in this signal loop, the data slicer 136 resolves the analog value of $V_{diff}$ in differential form as (sig, sigb), and outputs the digital equivalent, which in turn can be provided as feedback to the charge coupling DAC assembly 135, or through the series of flip-flop latches 137 to 138 back to the charged coupling DAC assembly 135. The charge coupling DAC assembly 135 can thus dynamically couple a scaled feedback-dependent charge into $V_{diff}$, thus defining the signal loop.

This signal loop achieves a single-cycle operation when operating at high operating frequencies, for example, 24 Gbaud or above. As a result, the latency to create the pre-processed $V_{diff}$ signal (for example, from S/H circuit 133) becomes irrelevant to the signal loop timing, provided S/H circuit 133 has adequate bandwidth to track $V_{diff}$ onto common nodes {sig, sigb} while DAC assembly 135 precharges during clock phase ϕ. Additionally or alternatively, multi-cycle feed forward equalization (FFE) can be included prior to the signal loop, regardless of the latency in generating the $V_{diff}$ signal.

Referring to FIG. 2A, the timing diagram 200 further reveals the single-cycle nature of the signal loop. The $V_{diff}$ and $V_{cm}$ signals are being sampled during clock phase ϕ (e.g., high) while being held during clock phase ϕb (e.g., low). At the end of the sampling phase ϕ, the switches implemented in the S/H circuits in FIGS. 1A to 1D turns to high-impedance. By then, the S/H circuits will have swiftly charged the {sig,sigb} load capacitances to the sampled $V_{diff}$ voltage. The $V_{diff}$ impedance and low S/H on-resistance can be kept sufficiently low so that a time constant, also known as RC time constant and capable of resolving $V_{diff}$ as developed on the {sig,sigb} load capacitances, is kept sufficiently low to achieve this swift charging. Diagram 200 shows DFE loop cycle 206A, in which the signal loop is activated to modulate the analog voltage on the output terminals of the S/H circuits in FIGS. 1A to 1D during clock phase ϕb and activated to resolve digital data back into charge coupled DFE assemblies during clock phase ϕ.

Because $V_{diff}$ is a differential signal pair, so too is the sampled and held signal {sig, sigb}. Simultaneously during the sample phase ϕ, one terminal of the multiple load capacitances (e.g., on charge coupling DAC assembly 105 of FIG. 1A, charge-coupling DAC assembly 115 of FIG. 1B, charge-coupling DAC assembly 125 of FIG. 1C, and charge-coupling DAC assembly 135 of FIG. 1D) also sees the same sampled $V_{diff}$ voltage {sig,sigb}. The operating details have been discussed above in association with, for example, FIGS. 4A-4B.

The $V_{diff}$ path, for example, from receiving interface 131 of FIG. 1D up to the S/H circuit 133, influences the signal loop until the end of this sample phase ϕ. Here, the charge coupling DAC assembly's combinational logic control path is undergoing a setup time while the RSA's digital output toggles and settles. Located in the DFE signal loop, this combinational logic will determine the amount and direction of charge to couple into the nodes for {sig,sigb} during the next hold phase ϕb.

Upon the start of the hold phase ϕb, the {sig,sigb} voltage imposed by $V_{diff}$ is capacitively held. The net capacitance on each node of {sig,sigb} and {mod,modb} is kept constant throughout the entirety of both sample and hold phases, regardless of the DFE coefficients being used. Having satisfied the setup time to its control path, the charge coupling DAC assembly's "couple" function may now commence at the start of the ϕb clock phase, resulting in the charge sharing effect of digitally switching a configured multiplicity of DAC capacitors onto each node of {sig,sigb}. In effect, the charge coupled onto a high impedance capacitance implements an analog mixing function without the need for a separate summing circuitry that otherwise would incur delay in this critical timing loop.

This charge coupling serves to modify the voltage of {sig, sigb} in direct proportion to the ratio of the coupled capacitance with respect to the total {sig, sigb} capacitance, as well as in direct proportion to the delta-V introduced by said digitally-switched node. Switching this node digitally from $V_{dd}$ to $V_{ss}$ has a consequence of adding a negative voltage to the ganged capacitor terminal, while switching from $V_{ss}$ to $V_{dd}$ adds a positive voltage. Complementary digital coupling on each of sig and sigb terminals thus results in a differentially summed analog signal on {sig,sigb}. This approach has the distinct advantage of keeping the instantaneous common mode voltage intact, since the sum of the voltage changes to sig and sigb add up to zero.

Moreover, because the $V_{dd}$ and $V_{ss}$ voltages are not active variables, modifying the coupled voltage requires configuring the multiplicity of coupling capacitor by way of a proportional digital coefficient. The direction of coupling (positive or negative) can depend on the sense of the digital feedback data $D_{-1}$ to $D_{-k}$, as well as the sign of said digital coefficient. The number of coefficients correspond to the number of taps. These taps are generally contiguous or otherwise defined by the design application. Each tap can feed to a separate DAC. Each coefficient's resolution depends on the proportion of the smallest switched capacitor value with respect to the total capacitance at each node {sig,sigb}, while the coefficient's range can depend on the total available switched capacitors per tap. In various implementations, the capacitors can be configured as binary gray-encoded grouping, or thermometer encoded grouping, or a combination thereof, or an alternate grouping altogether, each with implications to control timing, electrical parasitics, power consumption and layout area.

Referring to FIG. 1D, although strictly not within the signal loop, the {mod,modb} inputs to the data slicer 136 (including a receiver sense amplifier (RSA)) must be ready and set up coincident with the {sig,sigb} path to achieve proper summing at the RSA. To start with, the instantaneous common mode voltage of {mod,modb} is established during the sampling $\phi$ clock phase of $V_{cm}$ path that traverses S/H circuit 132. Summed on top of this initial {mod,modb}voltage by way of charge coupling, the differential value of {mod,modb} can represent the negative of the RSA's input-referred offset voltage, effectively nulling this offset voltage once summed by the RSA. In such use case, ThreshMod DAC 134 generates the differential offset cancellation voltage similarly by virtue of charge sharing on the capacitive {mod,modb} nodes during the $\phi$b clock phase. ThreshMod DAC 134 thus can utilize its own threshold modifying coefficients that are discovered via offset calibration algorithm, with similar considerations to sign, resolution and range.

Because the $V_{diff}$ input rides on top of the instantaneous common mode voltage $V_{cm}$, the {sig,sigb} nodes naturally contain the same $V_{cm}$. Introducing $V_{cm}$ as the common mode voltage to {mod,modb} can thus eliminate the common mode voltage difference between {sig,sigb} and {mod,modb}, thereby maximizing common mode rejection at the data slicer 136 by minimizing common mode to differential conversion.

The impedance of charge coupling DAC assembly is chosen for fast settling of the coupled DFE voltage. Consequently, the differential analog summation between the sampled $V_{diff}$ voltage and the coupled DFE voltages are substantially accomplished in advance of the completion of phase $\phi$b. This allows the subsequent $\phi$ phase to occur early for certain components in the loop with minimal impact to setup time for said components. Specifically, applying this $\phi_{early}$ clock to the downstream RSA (in data slicer for summing operation) provides a head start to the downstream RSA at resolving the analog {sig,sigb} voltage in the signal loop. The same timing head start also applies to the digital switch impedance of ThreshMod, thereby raising the readiness of {mod,modb} to an early $\phi_{early}$ clock. Some implementations can have the equivalent of 1 slow gate delay or 2 fast inverter delay. However, the setup and hold times for each component can be different. Thus, the amount of gap itself may not be determinative of the actual delay.

Returning to FIG. 2A, the timing diagram 200 hence shows the early activation of the RSA's sense and regenerate function due to $\phi_{early}$. The RSA's digital output is latched by the end of $\phi_{early}$, at which point it is safe for the RSA to pre-charge internal nodes in preparation for the next data bit. This early latching also facilitates early control path settling as the RSA digital output is provided as feedback to the charge coupling DFE, before the $\phi$b clock phase initiates the charge coupling action. Such logic processing selects from two possible parts of the charge coupling DFE based on the RSA output data: one part can couple a positive differential DFE while the other half can couple a negative differential DFE. The unselected part remains pre-charged, while the selected part couples a measured amount of charge in proportion to the configured coefficient.

A multiplicity of charge coupling DAC assemblies (e.g., the DAC assemblies) thus allow charge coupling of higher order DFE taps, using data that has been correspondingly cycle-latency-delayed by state registers. Each tap's DFE voltage contribution can depend on the state of the register's digital data, as well as the particular tap's coefficient. A linear charge summation occurs at {sig,sigb}, whose capacitance is independent of the tap coefficients, and whose $V_{cm}$ is unmodified by the RSA or register data pattern.

The charges injected by the aforementioned charge coupling DFE can be predominantly withdrawn at the start of the next 4) clock phase. Here, the prior-selected part now gets pre-charged, while the unselected other part remains pre-charged. Such action may predominantly achieve preservation of the net sampled charge at each node of {sig,sigb}. Otherwise an asymmetrically pumped/reabsorbed charge can result in accumulated voltage creep and/or current leakage as seen at the input of the S/H switches.

The gap between $\phi_{early}$ and $\phi$ constitutes a sensing phase for summing RSA in data slicer. As the next $\phi$ phase commences, the input to the RSA input starts to see the next bit from $V_{diff}$ while the RSA continues to regenerate the previously sensed bit all the way to CMOS levels. As such, the RSA from, for example, data slicer can result in gain enhancements to this sensing phase, while restricting RSA-input gain during regeneration in order to protect hold time margin. This example generally eliminates the need for a discrete phase to physically disconnect {sig,sigb} from the RSA's differential inputs. The same situation applies to the RSA's {mod,modb}inputs.

Some prior art configurations may actively amplify the input differential signal simultaneously with introducing DFE current during a specific clock phase, which makes the resulting sum very sensitive to jitter in the clock pulse. In contrast, implementations of the present disclosure utilize an RC-settled signal that is largely invariant to practical pulse width variations. Furthermore, low-impedance coupling of DFE charge onto a held input voltage may minimize thermal noise compared to active summing amplifiers. As a result, implementations of the present disclosure can not only improve the timing in the signal loop, but can also reduce jitter sensitivity and thermal noise sensitivity.

Additionally, implementations of the present disclosure can be readily extended to multi-cycle loop unrolled (e.g. half-rate or quarter rate architecture) situations as well, with the benefit of reducing the number of additional unit interval (UI) latencies for providing a function of the resolved receiver data bit as feedback into the analog receiver input stream, and/or increasing the frequency of operation to enhance the baud rate. In some implementations, the onchip Vu generator in the receiving interface 131 can dictate the average $V_{cm}$ as, for example, $V_{tt}=0.5 \times V_{dd}$ to potentially minimize transistor overvoltage effects, and for the benefit of complementary CMOS switches The implementations described in the present disclosure can set Vcm of the received data stream to a prescribed average level suitable for downstream circuitry, such as continuous time linear equalization (CTLE) on $V_{diff}$. An alternative active CTLE implementation can include gain control, low-frequency attenuation, mid-band shaping, and/or high frequency amplification.

Figure 6A:
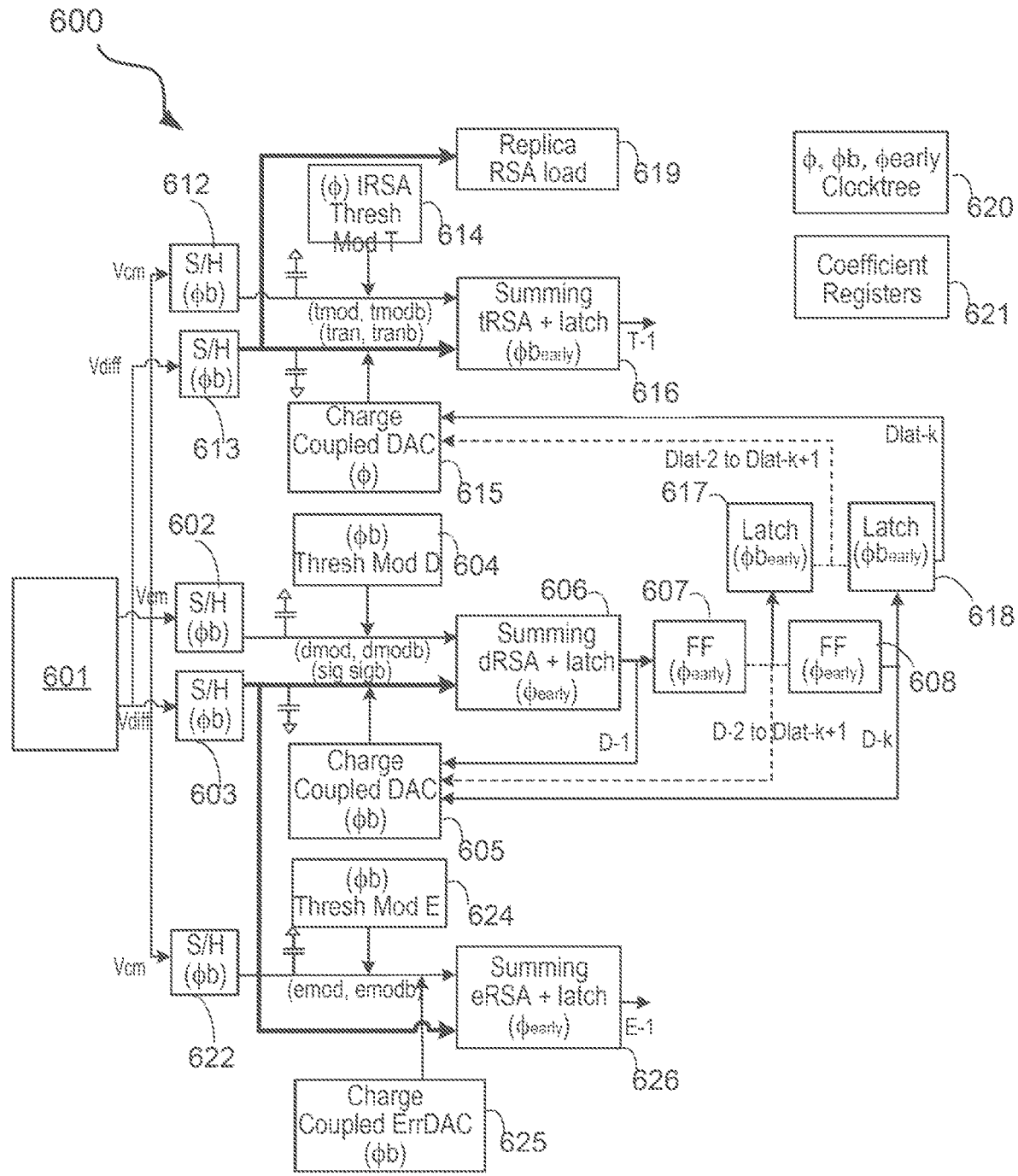
FIG. 6A illustrates an example of a receiver equalizer that includes the bifurcated signal paths for the data regenerative sense-amplifier (dRSA), transition RSA (tRSA) and error RSA (eRSA), each arranged in a differential configuration for bi-level non-return-to-zero (NRZ) signaling.

FIG. 6A shows an example of a receiver equalizer 600 that includes the main signal and threshold modifying paths for a data receiver sense-amplifier (dRSA), transition RSA (tRSA) and error RSA (eRSA). Similar to receiving interface 101 of FIG. 1A, receiving interface 601 can also include a T-coil network, an electrostatic discharge (ESD) protection circuit, a resistive termination network (RxZ), an AC-coupled passive continuous time linear equalizer (CTLE) or an alternate active CTLE, and an on-chip Vtt generator (Vttgen).

As discussed above in association with FIG. 1D, the data RSA path also includes S/H circuits 602 and 603 respectively for the $V_{cm}$ and $V_{diff}$ branches, both of which operate on differential analog signals. On the $V_{diff}$ branch, a data slicer 606 can include a comparator and latch to provide a feedback to the differential pair of sig and sigb. The feedback is provided as a modulation output from charge coupled DAC assembly 605, which can include DACs arranged as charge coupling capacitor modules as discussed for FIG. 1D.

As illustrated, flip-flop (FF) latches 607 and 608 are arranged in series and can latch the resolved digital signal from the data slicer 606. The coefficients for summing the scaled latched instances of resolved digital signal are located in coefficient register 621. On the $V_{cm}$ branch, a charge coupled threshold modifying DAC 604 can provide a modulation output to the differential pair of mod and modb, also like the arrangement of FIG. 1D. As illustrated, a clock tree 620 provides deskewed φ or φb to various clocked components in FIG. 6.

Similar to the dRSA path, the tRSA path connects to the same $V_{diff}$ input at S/H circuit 613 and $V_{cm}$ input at S/H circuit 612. However, the S/H circuits 612, 613 in the tRSA path are clocked on φb, rather than φ, i.e., at ½ clock cycle offset relative to the dRSA path, in this full-rate configuration. This transition path serves to sample the received bitstream's transition voltage rather than the data voltage. In this configuration, a transition signal slicer 616 generates resolved transition signal $T_1$.

The tRSA path also includes a charged coupled DAC assembly 615 that is connected to differential pair {tran, tranb} of the $V_{diff}$ branch. However, the feedback signals for the DFE 615 are taken from the data slicer 605 in the dRSA path rather than from the transition slicer 616. The instances of resolved signal $D_{-2}$ to $D_{-k}$ are each delayed by an additional ½ clock cycle using staging latches, e.g., latches 617 and 618, and fed as input to the tRSA path's charge coupling DAC assembly 615. To match timing between data and transition paths, the $V_{diff}$ branch may see two RSA loads that also includes a replica RSA load 619, as depicted in FIG. 6.

On the $V_{cm}$ branch of the tRSA path, a charge coupled threshold modifying DAC 614 can provide a modulation output to the differential pair of mod and modb, like the arrangement of FIG. 1D.

The eRSA path includes a dual input error slicer 626 which receives the differential data signal {sig,sigb} as well as a differential error signal {emod,emodb}. The $V_{diff}$ branch of eRSA path and the data path (the $V_{diff}$ branch of dRSA path) share the same physical input signal lines (i.e., differential output from S/H circuit 603). This feature can allow minimal divergence in the sampled analog signal. As the differential data signal {sig,sigb} already has a charge coupled DAC assembly 605, there is no need for an additional DFE applied to the data signal in the eRSA path.

The $V_{cm}$ branch of the eRSA path has a S/H circuit 622 that is coupled to both a separate threshold modifying threshold modifying DAC 624 (ThreshModE) and a charge coupled error DAC 625. Thus, the dual input error slicer 626 receives both the output of the S/H circuit 622, as modulated by the threshold modifying DAC 624 and error DAC 625, and the output of the S/H circuit 603, as modulated by the DAC assembly 605. The eRSA path serves as a non-destructive "measuring tool" for the signal seen by the dRSA. Producing a separately sampled {esig,esigb} signal may not be advisable because the {esig,esigb} signal may not be identical to the {sig,sigb} signal in view of variations in manufacturing, noise and parasitic capacitance.

To implement threshold modifying error DAC 625, additional charge-coupling blocks can be ganged to the {emod, emodb} signals for measured amounts of additive or subtractive voltage, depending on the error DAC's coefficient's sign and magnitude. This additive or subtractive voltage is summed along with the modulation output from threshold modifying DAC 624 (ThreshModE), which is also signed and scaled. This summation obviates the need for yet a third pair of summing RSA inputs. The eRSA path's clock phases may mirror that of the dRSA path. No timing penalty is experienced by such parallel summing, where any additional capacitive loads on {emod,emodb} may simply reduce the voltage contribution of coupling each coefficient bit. The resolutions are factored into the choice of capacitances, and dummy loads can serve to match the load capacitance on {dnul,dnulb} versus {enul,enulb} to equalize their relative bit resolution.

Figure 6B:
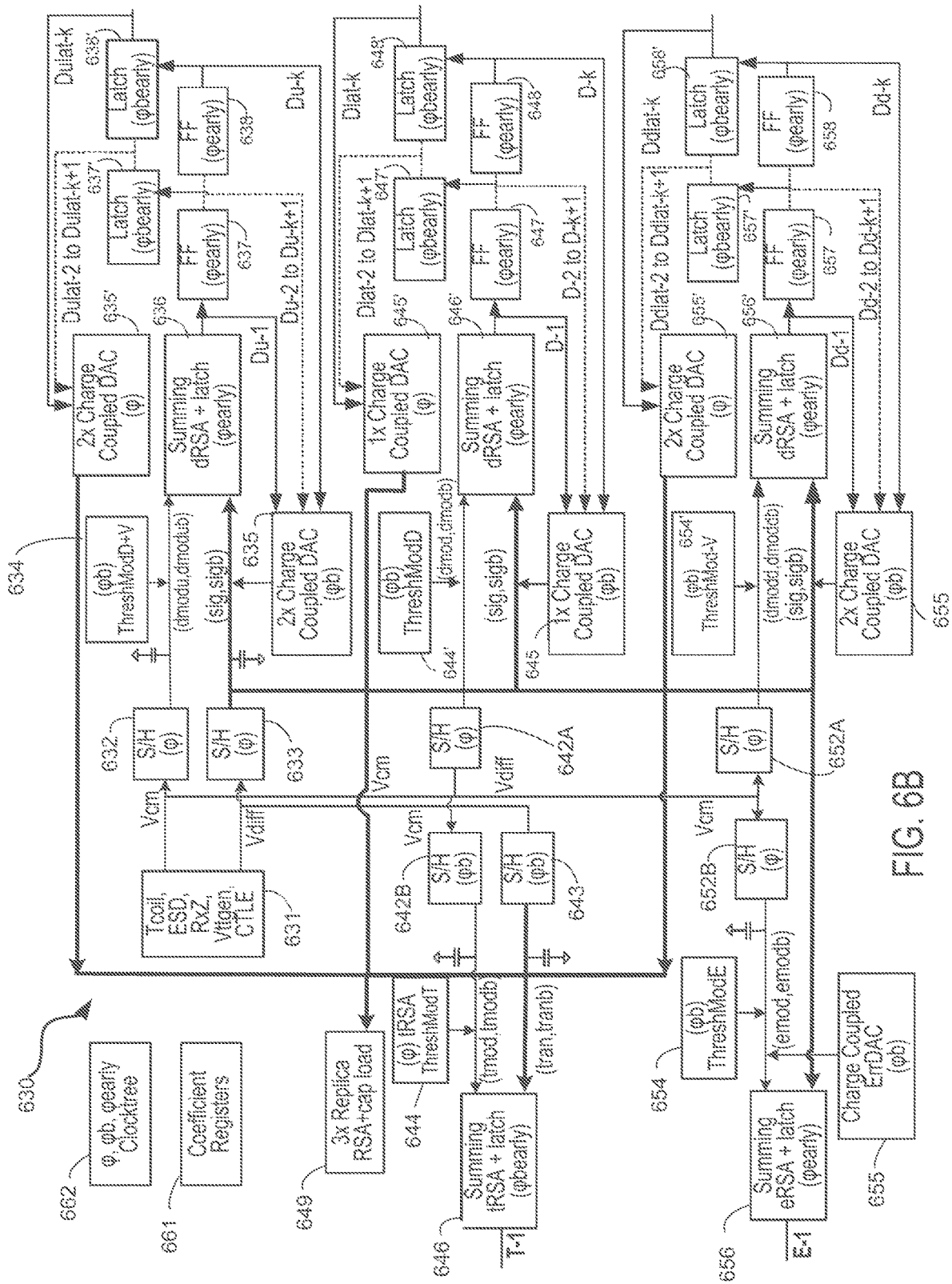
FIG. 6B illustrates an example of a receiver equalizer including bifurcated signal paths for dRSA, tRSA and eRSA, and capable of handling input data stream in quad-level pulse-amplitude modulation (PAM4) signaling.

FIG. 6B shows an example of a receiver equalizer 630 for PAM4 (pulse-amplitude modulation) that also includes the main signal and threshold modifying paths for three data receiver sense-amplifiers (dRSA), a transition RSA (tRSA) and an error RSA (eRSA).

Receiving interface 631 is similarly arranged as receiving interface 601 of FIG. 6A. Thereafter, the data path includes S/H circuits 632, 642A and 652A for the $V_{cm}$ branches and S/H circuit 633 for the $V_{diff}$ branch, both of which can operate on differential analog signals.

Regarding main signal and offset modifying paths for a three data receiver sense-amplifiers (dRSA) on the $V_{diff}$ branch, the output from S/H circuit 633 can drive data slicer 636, data slicer 646', and data slicer 656', each of which can include a comparator and latch to provide a feedback to the differential pair of sig and sigb. For example, for data slicer 636, the feedback is provided as a modulation output from charge coupled DAC assembly 635, which can include DACs arranged as charge coupling capacitor modules as discussed for FIG. 1D. Flip-flop (FF) latches 637 through 638 are arranged in series and together with the latched slicer output, provide the digital signal $D_{u-1}$ through $D_{u-k}$ to charge coupled DAC assembly 635. The coefficients for summing the scaled latched instances of resolved digital signal can be located in coefficient register 661. An additional set of half latches 637' through 638' can introduce digital signals $D_{ulat-2}$ through $D_{ulat-k}$ to charge coupled DAC assembly 635' which provides a feedback to the differential pair of tran and tranb.

Similarly, for data slicer 656', the feedback is provided from charge coupled DAC assemblies 655, and FF latches 657 through 658 are arranged in series and together with the latched slicer output, provide the digital signal $Dd_{-1}$ through $Dd_{-k}$ to charge coupled DAC assembly 655. An additional set of half latches 657' through 658' can introduce digital signals $D_{dlat-2}$ through $D_{dlat-k}$ to charge coupled DAC assembly 655' which provides a feedback to the differential pair of tran and tranb. Additionally, data slicer 646' can provide the feedback from charge coupled DAC assemblies 645, and FF latches 647 through 648 are arranged in series and together with the latched slicer output, provide the digital $D_{-1}$ through $D_{-k}$ to charge coupled DAC assembly 645. A further set of half latches 647' through 648' can introduce digital signals $D_{lat-2}$ through $D_{lat-k}$ to charge coupled DAC assembly 645' which provides a feedback to the differential pair of tran and tranb. Charge coupled DAC assemblies 635', 645', and 655' modulate the (tran,tranb) output of S/H circuit 643, and drive the RSA+cap load 649 as well as transition slicer 646. As illustrated, load 639 represents a three times (3X) replica load compared to a slicer capacitance load. On the other hand, charge coupled DAC assemblies 635, 645, and 655 modulate the (sig, sigb) output of S/H circuit 633, and drive data slicers 636, 646', 656' and error slicer 656.

On the $V_{cm}$ branch, subsequent to S/H circuit 632, a threshold modifying DAC 634 can provide a modulation output for the D+V side used as the positive-region PAM4 signal threshold, to the differential pair of $d_{modu}$ and $d_{modub}$, like the arrangement of FIG. 1D. As illustrated, a clock tree 662 provides deskewed $\phi$ or $\phi b$ to various clocked components. Subsequent to S/H circuit 642A, a charge coupled threshold modifying DAC 644' can provide a modulation output for the D side used as the zero-region PAM4 signal threshold, to the differential pair of $d_{mod}$ and $d_{modb}$. Subsequent to S/H circuit 652A, a charge coupled threshold modifying DAC 654' can provide a modulation output for the D-V side used as the negative-region PAM4 signal threshold, to the differential pair of dmodd and dmoddb.

Similar to the dRSA path, the tRSA path connects to $V_{diff}$ input at S/H circuit 643 and $V_{cm}$ input at S/H circuit 642B. However, the S/H circuits 642B and 643 in the tRSA path are clocked on $\phi b$, rather than $\phi$, i.e., at ½ clock cycle offset relative to the dRSA path, in this full-rate configuration. This transition path serves to sample the received bitstream's transition voltage rather than the data voltage. In this configuration, a transition signal slicer 646 can generate resolved transition signal Li, and a charge coupled threshold modifying DAC 644 can provide threshold modification output to the differential pair of tmod and tmodb.

The eRSA path includes a dual input error slicer 656 which receives the differential data signal {sig,sigb} as well as a differential error signal {emod,emodb}. The $V_{diff}$ branch of eRSA path and the data path (the $V_{diff}$ branch of dRSA path) share the same physical input signal lines (i.e., differential output from S/H circuit 633). As discussed in association with FIG. 6A, this feature can allow minimal divergence in the sampled analog signal.

The $V_{cm}$ branch of the eRSA path has a S/H circuit 652B that is coupled to both a separate threshold modifying (or offset nulling) DAC 654 (ThreshModE) and a threshold modifying error DAC 655. Thus, the dual input error slicer 656 receives both the output of the S/H circuit 652B, as modulated by the threshold modifying DAC 654 and error DAC 655, and the output of the S/H circuit 633, as modulated by the DAC assemblies 635, 645 and 655. As discussed in association with FIG. 6A, the eRSA path serves as a non-destructive "measuring tool" for the signal seen by the dRSA.

When implementing threshold modifying error DAC 655, additional charge-coupling blocks can be ganged to the {emod,emodb} signals for measured amounts of additive or subtractive voltage, depending on the error DAC's coefficient's sign and magnitude. Similar to the discussion in association with FIG. 6A, this additive or subtractive voltage is summed along with the modulation output from threshold modifying DAC 654 (ThreshModE), which is also signed and scaled. This summation obviates the need for yet a third pair of summing RSA inputs. The eRSA path's clock phases may mirror that of the dRSA path. No timing penalty is experienced by such parallel summing, where any additional capacitive loads on {emod,emodb} may simply reduce the voltage contribution of coupling each coefficient bit. The resolutions are factored into the choice of capacitances, and dummy loads can serve to match the load capacitance on {dmod,dmodb} versus {emod,emodb} to equalize their relative bit resolution.

Figure 7:
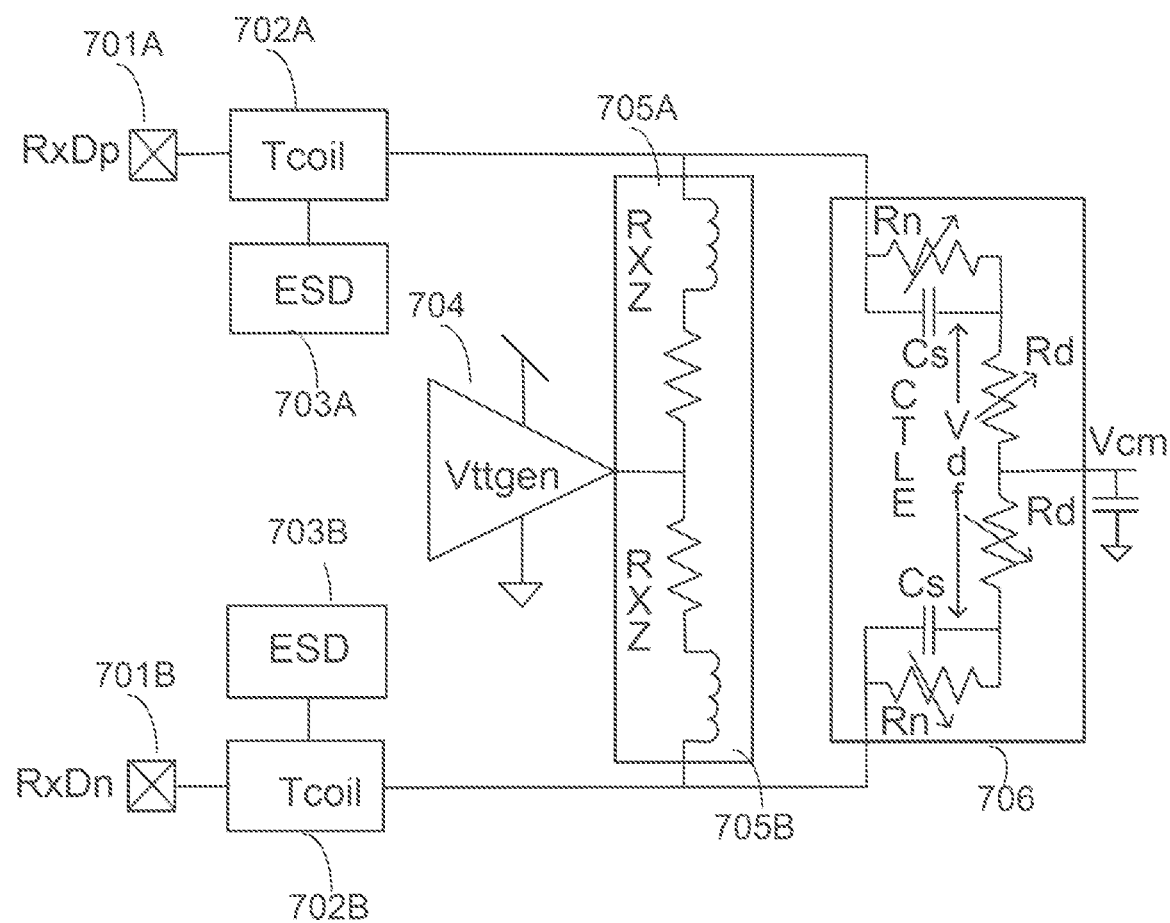
FIG. 7 illustrate an example of a front end for a receiver equalizer.

FIG. 7 shows an example of a front end for a receiver equalizer according to some implementations of the present disclosure. The front end may also be referred to as a receiving interface. An AC-coupled transmission line drives input terminals RxDP (701A) and RxDN (701B). Input terminals 701A and 701B respectively couple to T-coil networks 702A and 702B, both may include mutual inductors configured for improving impedance matching and reducing the input return-loss. T-coil networks 702A and 702B can respectively include electrostatic discharge (ESD) protection circuits 703A and 703B. Resistive termination network (RxZ) 705A and 705B can respectively connect to T-coil networks 702A and 702B to improve, for example, impedance matching. Resistive termination network (RxZ) 705A and 705B are coupled to $V_{ttgen}$ 704, which may dictate the average low-frequency common mode voltage ($V_{cm}$) driving continuous time linear equalizer (CTLE) 706. $V_{ttgen}$ 704 may be implemented onchip or offchip. A nominal bias voltage may be set at $V_{dd}/2$.

In FIG. 7, $V_{cm}$ can track the instantaneous common mode voltage, whose tracking bandwidth is determined by the load capacitance on $V_{cm}$ and the equivalent series resistance leading to the load capacitance. In the illustration, the differential cutoff frequency of CTLE 706 is inversely proportional to $C_s*R_d*R_n/(R_d+R_n)$, while its DC-attenuation increases in proportion to $R_n/(R_d+R_n)$. In alternative implementations using active CTLEs instead of the passive one illustrated right upstream from the DFE loop, $V_{cm}$ is simply generated by a center-tapped resistance between the active CTLE's outputs, with appropriate shunt capacitance to form the effective RC. Since the $R_d+R_n$ path of CTLE 706 presents a parallel termination impedance to the RxZ components (coupled to $V_{ttgen}$ 704), the calibration of the RxZ components may compensate for the DC attenuation caused by the $R_d+R_n$ path. In some cases, the $R_d+R_n$ path may affect 3% or less of the total equivalent termination impedance.

What has been described is a method and apparatus which can be employed on a receiver terminal to mitigate the deleterious effect of inter-symbol interference. Indeed, a number of implementations have been described for effective receiver equalization (RxEQ) based on combinations of feed-forward equalization (FFE), continuous time linear equalization (CTLE), decision feedback equalization (DFE). DFE implementations can particularly minimize the unit interval (UI) latencies needed to feedback a function of the resolved Rx data bit into the analog Rx input stream. Implementations also incorporate sample and hold (S/H) mechanisms as well as data-driven charge coupling using switched capacitors to improve circuit headroom. In particular, linear analog amplifiers are kept outside the signal loop for providing the feedback of digitally resolved Rx data bit into the analog Rx input stream. Implementations are also capable of extracting input common mode voltage ($V_{cm}$) modulation information from a CTLE upstream of the signal loop, which $V_{cm}$ when factored into a summing RSA downstream of the signal loop, improves common mode rejection. Nevertheless, it will be understood that various modifications can be made without departing from the spirit and scope of the subject innovation. In addition, the logic flows depicted in the figures do not require the particular order shown, or sequential order, to achieve desirable results. In addition, other steps may be provided, or steps may be eliminated, from the described flows, and other components may be added to, or removed from, the described systems. Accordingly, other implementations are within the scope of the following claims.

What is claimed is:

1. A mixed signal receiver, comprising:
a first sample and hold (S/H) circuit having a first S/H input terminal to receive an analog input signal and a first S/H output terminal directly coupled to a first common node, wherein the first S/H circuit is configured to perform cycles at a symbol rate with each cycle including a sample phase and a hold phase, and wherein the first S/H circuit is configured to track the analog input signal on the first S/H output terminal during the sample phase and to generate a high impedance on the first S/H output terminal during the hold phase to enable a sampled analog output voltage to be modulated during the hold phase;
a plurality of slicers that comprise a first data slicer having a first input terminal coupled to the first common node such that the first data slicer is directly driven by the first S/H output terminal; and
a plurality of data-driven charge coupling digital-to-analog converters (DACs) that comprise a first data-driven charge coupling digital-to-analog converter (DAC) including
(i) a DAC input terminal to receive a first digital signal from a first digital output of the first data slicer,
(ii) a DAC output terminal directly coupled to the first common node,
(iii) a plurality of capacitor modules configured to be pre-charged such that the DAC output terminal tracks an output voltage on the first S/H output terminal during the sample phase, and
(iv) logic components at an interface of the first data-driven charge coupling DAC to receive the first digital signal and to control voltages applied to the plurality of capacitor modules based on the first digital signal such that responsive to the logic components toggling a voltage on the plurality of capacitor modules, charge is capacitively coupled to or from the first common node during an immediately subsequent hold phase to modulate the output voltage at the first S/H output terminal during the immediately subsequent hold phase.

2. The mixed signal receiver of claim 1, wherein the plurality of slicers comprise a plurality of data slicers, and wherein the respective first input terminal of each respective data slicer of the plurality of data slicers is connected in common to the first common node and the respective DAC output terminal of each data-driven charge coupling DAC is connected in common to the first common node.

3. The mixed signal receiver of claim 1, wherein the plurality of slicers comprise a transition slicer, wherein the first input terminal of the first data slicer is connected in isolation from the first input terminal of the transition slicer to the first common node, and wherein the respective first input terminal of the transition slicer is connected in isolation from the first input terminal of the first data slicer to a third common node.

4. The mixed signal receiver of claim 3, wherein the respective DAC output terminal of each data-driven charge coupling DAC that is coupled to the first input terminal of the first data slicer is connected to the first common node in isolation from the DAC output terminal of any data-driven charge coupling DAC that is coupled to the input terminal of the transition slicer, and the respective DAC output terminal of each data-driven charge coupling DAC that is coupled to the input terminal of the transition slicer is connected to the third common node in isolation from the DAC output terminals of any other data-driven charge coupling DAC that is coupled to the input terminal of the first data slicer.

5. The mixed signal receiver of claim 3, further comprising a second sample and hold (S/H) circuit having a second S/H input terminal and a second S/H output terminal, wherein the second S/H input terminal is configured to receive a single-ended or differential signal voltage of the analog input signal, wherein the second S/H output terminal is directly coupled to the third common node.

6. The mixed signal receiver of claim 5, wherein the second S/H circuit is configured to track the single ended or differential signal voltage on the second S/H output terminal during the hold phase and to generate a high impedance on the second S/H output terminal during the sample phase to enable the sampled single ended or differential signal voltage to be modulated during the sample phase such that (i) a respective DAC output terminal of any data-driven charge coupling DAC that is coupled to the input terminal of the transition slicer tracks the single-ended or differential signal voltage on the second S/H output terminal of the second S/H circuit during the hold phase (ii) the charges on a capacitor module of any data-driven charge coupling DAC that is coupled to the input terminal of the transition slicer are coupled to the second S/H output terminals of the second S/H circuit during the sample phase.

7. The mixed signal receiver of claim 1, comprising one or more latches connected in a series between the first digital output of the first data slicer and the respective DAC input terminal of a corresponding charge coupling DAC to provide one or more digital signals, and wherein the logic components of the corresponding DAC are configured to receive the one or more digital signals through the one or more latches.

8. The mixed signal receiver of claim 1, wherein the logic components of the first data driven charge coupling DAC are configured to receive the first digital signal without an intervening latch.

9. The mixed signal receiver of claim 1, further comprising a threshold modifying DAC containing logic components configured to:
receive logic signals from one of: an adaptation logic controller, a state machine, or a microcontroller; and
determine how to pre-charge a capacitor module and whether to retain a pre-charged voltage based on a decision function that does not include data slicer or latch output as an input value.

10. The mixed signal receiver of claim 9, comprising a second S/H circuit having a second S/H input terminal and a second S/H output terminal,
wherein the second S/H input terminal is configured to receive a common mode or reference voltage of the analog input signal,
wherein the second S/H output terminal is directly coupled to a second common node,
wherein the first data slicer includes a second slicer input terminal coupled to the second common node, and
wherein a first terminal of each capacitor module of the threshold modifying DAC is directly coupled to the second common node.

11. The mixed signal receiver of claim 10, wherein the first S/H input terminal of the first S/H circuit is configured to receive a single-ended voltage of the analog input signal.

12. The mixed signal receiver of claim 10, wherein the first S/H circuit comprises a pair of first S/H input terminals configured to receive a differential signal voltage of the analog input signal.

13. The mixed signal receiver of claim 10, further comprising:
a second threshold modifying DAC;
a third sample and hold (S/H) circuit having a third S/H input terminal and a third S/H output terminal, wherein the third S/H input terminal is configured to receive the reference voltage or common mode voltage of the analog input signal, wherein the third S/H output terminal is directly coupled to a corresponding third common node, and wherein the third S/H circuit is configured to track the reference voltage or common mode signal voltage on the third S/H output terminal during the sample phase and to generate a high impedance on the third S/H output terminal during the hold phase such that a sampled reference voltage or common mode signal voltage is modulated during the hold phase, wherein (i) a respective DAC output terminal of the second threshold modifying DAC tracks an output reference or common mode voltage on the second S/H output terminal of the second S/H circuit during the sample phase, and (ii) the charges on capacitor modules of the second threshold modifying DAC are coupled to the third S/H output terminal of the third S/H circuit during the hold phase; and
an error slicer driven by the third S/H circuit and the first S/H circuit, wherein the error slicer and the first data slicer are configured to sense the same modulated analog signal at the first S/H output terminal of the first S/H circuit.

14. The mixed signal receiver of claim 13, further comprising:
a third threshold modifying DAC;
a fourth sample and hold (S/H) circuit having a fourth S/H input terminal and a fourth S/H output terminal, wherein the fourth S/H input terminal is configured to receive the reference voltage or common mode voltage of the analog input signal, wherein the fourth S/H output terminal is directly coupled to a fourth common node, and wherein the fourth S/H circuit is configured to track the reference voltage or common mode signal voltage on the fourth S/H output terminal during the hold phase and to generate a high impedance on the fourth S/H output terminal during the sample phase to enable the sampled reference voltage or common mode signal voltage to be modulated during the sample phase such that (i) a respective DAC output terminal of the third threshold modifying DAC tracks an output common mode voltage on the fourth S/H output terminal of the fourth S/H circuit during the hold phase and (ii) the charges on capacitor modules of the third threshold modifying DAC are coupled to the fourth S/H output terminal of the fourth S/H circuit during the sample phase;
a fifth sample and hold (S/H) circuit having a fifth S/H input terminal and a fifth S/H output terminal, wherein the fifth S/H input terminal is configured to receive a single-ended or differential signal voltage of the analog input signal, wherein the fifth S/H output terminal is directly coupled to a fifth common node and wherein the fifth S/H circuit is configured to track the single ended or differential signal voltage on the fifth S/H output terminal during the hold phase and to generate a high impedance on the fifth S/H output terminal during the sample phase such that a sampled single ended or differential signal voltage is modulated during the sample phase such that (i) a respective DAC output terminal of a second data-driven charge coupling DAC tracks the single-ended or differential signal voltage on the fifth S/H output terminal of the fifth S/H circuit during the hold phase (ii) the charges on capacitor modules of the second data-driven charge coupling DAC are coupled to the fifth S/H output terminals of the fifth sample and hold circuit during the sample phase; and
a transition slicer driven by the fourth S/H output terminal of the fourth S/H circuit and the fifth S/H output terminal of the fifth S/H circuit, wherein the transition slicer is configured to resolve and settle the digital output signal on the DAC input terminal during the hold phase, and wherein the transition slicer is configured to latch and hold the digital signal on the DAC input terminal during the sample phase.

15. The mixed signal receiver of claim 13, further comprising
one or more latches connected in a series between the digital output of the first data slicer and the respective DAC input terminal of a corresponding data-driven charge coupling DAC, and
one or more half-latches, each half-latch being driven by a respective latch from the one or more latches connected in the series, wherein each half-latch is configured to provide a corresponding digital signal to the DAC input terminal of a respective charge coupling DAC from the one or more data-driven charge coupling DACs; and
wherein the half-latches are configured to settle the corresponding digital signal on the input terminal of the respective charge coupling DAC during the hold phase, and to hold the digital signal on the input terminal of the respective charge coupling DAC during the sample phase.

16. The mixed signal receiver of claim 15, wherein each charge coupling capacitor holds either a substantially identical quantum of switchable capacitance, or a variable quantum of switchable capacitance, and
wherein the variable quantum of switchable capacitance is according to powers of 2.

17. The mixed signal receiver of claim 10, wherein the logic components are configured to determine one or more of: a coupling direction, a coupling intensity, a coupling gating based on predetermined values stored in registers, a coupling gating using a controller or state machine, or a coupling gating based on one or more of a clock signal indicating a phase of a sample and hold (S/H) circuit, a digital signal from the one or more digital output signals from the first data slicer or latches, or a digital output signal from an error slicer.

18. The mixed signal receiver of claim 17, further comprising:
a linear amplifier configured to receive the input analog signal from a transmission channel and provide an analog voltage to one or more S/H input terminals,
wherein the analog voltage includes: a differential voltage output, or a single-ended voltage output.

19. The mixed signal receiver of claim 17, wherein the sampled analog output voltage comprises a differential analog output voltage, wherein the first S/H circuit comprises a pair of S/H output terminals to output the differential analog output voltage, and wherein the output terminals of the first data-driven charge coupling DAC are configured to symmetrically capacitively couple charge to or from the pair of S/H output terminals such that charge is augmented on one of the S/H output terminals while charge is simultaneously depleted on the other of the pair of S/H output terminals.

20. The mixed signal receiver of claim 1, wherein the first S/H input terminal of the first S/H circuit is configured to receive a single-ended or differential voltage of the analog input signal and the first S/H circuit is configured to track the single-ended or differential voltage on the first S/H output terminal during the sample phase and to generate a high impedance on the first S/H output terminal during the hold phase such that a sampled single-ended or differential voltage is modulated during the hold phase;

a second node to receive a reference voltage or common mode voltage;

a DAC having low-impedance outputs coupled to a second common node; and wherein the first data slicer is configured to receive a voltage from the first common node and to receive a voltage from the second common node.

21. A mixed signal receiver, comprising:

a first sample and hold (S/H) circuit having a first S/H input terminal to receive an analog input signal and a first S/H output terminal directly coupled to a first common node, wherein the first S/H circuit is configured to perform cycles at a symbol rate with each cycle including a sample phase and a hold phase, and wherein the first S/H circuit is configured to track the analog signal on the first S/H output terminal during the sample phase and to generate a high impedance on the first S/H output terminal during the hold phase such that a sampled analog output voltage is modulated during the hold phase; and a slicer module including a first data slicer comparator and a second data slicer comparator, each of the first data slicer comparator and second data slicer comparator having an input terminal directly coupled to the first common node, the slicer module further including a multiplexer configured to direct digital output signals from a selectable one of the first data slicer comparator and second data slicer comparator to a latch, the multiplexer selection being directed by the digital output of the latch which serves as the slicer module's output, wherein a corresponding data-driven DAC is not coupled to the first common node.

* * * * *

UNITED STATES PATENT AND TRADEMARK OFFICE
CERTIFICATE OF CORRECTION

| | | |
|---|---|---|
| PATENT NO. | : 12,107,707 B2 | Page 1 of 1 |
| APPLICATION NO. | : 18/217395 | |
| DATED | : October 1, 2024 | |
| INVENTOR(S) | : Michael A. Ang and Alan C. Rogers | |

It is certified that error appears in the above-identified patent and that said Letters Patent is hereby corrected as shown below:

On the Title Page

Column 1 (item (72)), Line 2 (second inventor residence), Delete "VA" and insert --CA--.

Signed and Sealed this
Twenty-sixth Day of November, 2024

Katherine Kelly Vidal
*Director of the United States Patent and Trademark Office*